United States Patent [19]

Ema et al.

[11] Patent Number: 5,237,579
[45] Date of Patent: Aug. 17, 1993

[54] SEMICONDUCTOR LASER CONTROLLER USING OPTICAL-ELECTRONIC NEGATIVE FEEDBACK LOOP

[75] Inventors: Hidetoshi Ema, Yokohama; Masaaki Ishida, Machida, both of Japan

[73] Assignee: Ricoh Co. Ltd., Tokyo, Japan

[21] Appl. No.: 824,015

[22] Filed: Jan. 22, 1992

[51] Int. Cl.$^5$ ................................................. H01S 3/13
[52] U.S. Cl. .......................................... 372/31; 372/38
[58] Field of Search .............................. 372/29, 31, 38

[56] References Cited

U.S. PATENT DOCUMENTS 5,123,024 6/1992 Dowd et al. ........................... 372/31
5,151,910 9/1992 Inuyama et al. ....................... 372/31

Primary Examiner—James W. Davie
Attorney, Agent, or Firm—Cooper & Dunham

[57] ABSTRACT

A semiconductor laser controller which controls an optical output of a semiconductor laser by using an optical-electronic negative feedback. At least two pairs of bipolar transistors are used for the optical-electronic negative feedback. The transistors are configured so that a time constant of the semiconductor laser controller can be improved by the small emitter-resistance of the transistors. Thus, a gain of the optical-electronic negative feedback can be varied without deteriorating a control speed.

23 Claims, 20 Drawing Sheets

SEMICONDUCTOR LASER CONTROLLER USING OPTICAL-ELECTRONIC NEGATIVE FEEDBACK LOOP

BACKGROUND OF THE INVENTION

The present invention relates generally to semiconductor laser controllers, and more particularly to a semiconductor laser controller which controls an optical output of a semiconductor laser used as a light source in a laser printer, optical disk storage, digital copier, light communication apparatus, etc.

Since a semiconductor laser can be made very small and achieve a direct modulation at a high speed, it has been recently widely used as a light source for optical disk storages, laser printer, etc. However, the optical output of semiconductor lasers is very sensitive to changes in temperature, and there exists a problem even when the driving current flowing therethrough is made constant, hence it is difficult to stably set the optical output thereof at a desired level. Accordingly, various Automatic Power Controllers have been developed to cope with the above problem.

The automatic power controllers are roughly classified into types which use one of the following three methods:

1. According to the first method, optical output of a semiconductor laser is always controlled by an optical-electronic negative feedback loop. A light-receiving element receives the optical output and generates light current proportional thereto. The light current is then compared with power-setting current which determines a desired optical output of the semiconductor laser. The (driving) forward current is adjusted so that the light current can be equal to the power-setting current. Thus, according to this method, the optical output is controlled stably (i.e., with high reliability) since it is always thus controlled.

2. According to the second method, forward current of the semiconductor laser is controlled, only during a power-adjusting period, so that the light current can correspond to the power-setting current. During a non-power-adjusting period, the forward current just adjusted during the previous power-adjusting period flows through the semiconductor laser. Thus, according to this method, the optical output can be controlled quickly (i.e., with a high response) since it is controlled only during the power-adjusting period.

3. The third method improves upon the second method in that it includes the temperature of the semiconductor laser among the controlled factors. The temperature of the semiconductor is measured, and the forward current and/or the temperature are then adjusted.

However, the above conventional methods have the following disadvantages. The first method has a disadvantage in having a low control speed, since the optical output is always controlled. In addition, a gain of the feedback loop cannot be compensated. Hereupon, a step response of the optical output of the semiconductor laser is approximated as follows:

$$P_{out} = P_0 [1 - \exp(-2\pi f_0 t)]$$

where $P_{out}$ represents the optical output of the semiconductor laser, $P_0$ represents a desired optical output of the semiconductor laser, $f_0$ represents a gain crossover frequency in a case where the optical-electronic negative loop is open, and t represents time. Generally, as to the control speed, a total light amount ($\int P_{out}$) of the semiconductor laser, defined below, must converge into a predetermined value within a settling time $\tau_0$, just after a change in the optical output:

$$\int P_{out} = P_0 \cdot t_0 \left\{ 1 - \frac{1}{2\pi f_0 \tau_0} [1 - \exp(-2\pi f_0 \tau_0)] \right\}$$

If an attempt is made to improve upon the control speed of the optical output of the semiconductor laser, by adjusting the gain crossover frequency $f_0$ in a case where $\tau_0$ is made to be 50 ns and an allowable error range is made to be 0.4%, $f_0$ must be higher than 800 MHz, which is extremely difficult.

On the other hand, the second and third methods have a disadvantage in having a low reliability since the optical output is not always controlled. As a result, the optical output is sensitive to disturbances, such as a DO loop characteristic, or return light which is often seen in an optical disk storage. The DO loop characteristic changes the optical output by several percents. The DO loop characteristic can be prevented, to some degree, from influencing the optical output by adjusting the forward current based on a heat time constant of the semiconductor laser, however, it cannot be completely prevented, in particular, in a light source using a plurality of semiconductor lasers, since each heat time constant is different for each semiconductor laser and the environment in corresponding semiconductor laser.

Incidentally, a semiconductor laser controller was disclosed in Japanese Laid-Open Patent Application No. 2-205086 designed to eliminate the above disadvantages. The semiconductor laser controller uses an optical-electronic negative loop which calculates a difference between the light current and the power-setting current, and converting means for converting the power-setting current into the forward current. The semiconductor laser is controlled by adding or subtracting a control signal, generated by the optical electronic negative loop to or from the forward current generated by the converter means. However, this disclosed semiconductor laser controller also has disadvantages in having low speed, low reliability, and low resolution.

SUMMARY OF THE INVENTION

Accordingly, it is a general object of the present invention to provide a novel and useful semiconductor laser controller in which the above disadvantages are eliminated.

Another object of the present invention is to provide a semiconductor laser controller which stably and quickly controls an optical output of a semiconductor laser.

Still another object of the present invention is to provide a semiconductor laser controller using an optical-electronic negative feedback in which a gain can be compensated.

According to a first feature of the present invention, an apparatus comprises a light-emitting element, a light-receiving element, optically coupled to the light-emitting element, which receives an optical output of the light-emitting element and generates light current proportional thereto, power-setting current generating means for generating power-setting current which determines a desired optical output of the light-emitting element, and control means, coupled to the light-emitting element, light-receiving element, and power-setting current generating means so as to construct an optical-electronic negative feedback loop, which control means includes a capacitor, coupled to the light-receiving element and power-setting current generating means, which compares the power-setting current with the light current to calculate control-error voltage, a high-impedance circuit, coupled to the capacitor, which amplifies the control-error voltage, a voltage-to-current converter, coupled to the high-impedance circuit, which converts the control-error voltage amplified by the high-impedance circuit into control-error current proportional to the control-error voltage, source voltage, a first pair of bipolar transistors, each emitter thereof being coupled to the voltage-to-current converter, each collector thereof being connected to the source voltage, each base thereof having the same potential, constant current source, a second pair of bipolar transistors, each base thereof being coupled to the voltage-to-current converter and each corresponding one of the emitters of the first pair of bipolar transistors, each emitter thereof being coupled to the constant current source, the second pair of bipolar transistors having a current amplification factor large enough to allow collector-current thereof to approximate emitter-current thereof, and a forward current converter, coupled to the second pair of bipolar transistors and the light-emitting element, which controls the optical output of the light-emitting element by controlling driving current flowing through the light-emitting element based on the collector-current of the second pair of bipolar transistors.

According to a second feature of the present invention, an apparatus comprises a light-emitting element, a light-receiving element, optically coupled to the light-emitting element, which receives an optical output of the light-emitting element and generates light current proportional thereto, power-setting current generating means for generating power-setting current which produces a desired optical output of the light-emitting element, control means, coupled to the light-emitting element, light-receiving element, and power-setting current generating means so as to construct an optical-electronic negative feedback loop, which control means compares the light current with power-setting current to generate a control-error, and applies the control-error to the light-emitting element to control the optical output thereof, a current-detecting circuit which detects a change in output of the control means when the power-setting current changes, a first digital-to-analog converter, a comparator which compares an output of the current-detecting circuit with that of the first digital-to-analog converter, memory means for storing an output of the comparator at a predetermined timing, a timing generating circuit which determines the predetermined timing, a second digital-to-analog converter which performs a digital-to-analog conversion in accordance with an output of the memory means, and a current adder which receives an output of the second digital-to-analog converter, and applies current proportional to the power-setting current with a proportional coefficient determined by an output of the second digital-to-analog converter, to the light-emitting element.

According to a third feature of the present invention, an apparatus comprises a light-emitting element, a light-receiving element, optically coupled to the light-emitting element, which receives an optical output of the light-emitting element and generates light current proportional thereto, power-setting current generating means for generating power-setting current which produces a desired optical output of the light-emitting element, control means, coupled to the light-emitting element, light-receiving element, and power-setting current generating means so as to construct an optical-electronic negative feedback loop, which control means compares the light current with the power-setting current to generate a control-error, and applies the control-error to the light-emitting element to control the optical output thereof, a digital-to-analog converter which performs a digital-to-analog conversion for forward current in accordance with a change of the power-setting current, and a current-detecting circuit which detects a change in output of the control means when the power-setting current changes.

Other objects and further features of the present invention will become apparent from the detailed description when read in conjunction with the accompanying drawings.

DETAILED DESCRIPTION OF THE PREFERRED EMBODIMENTS

Figure 1:
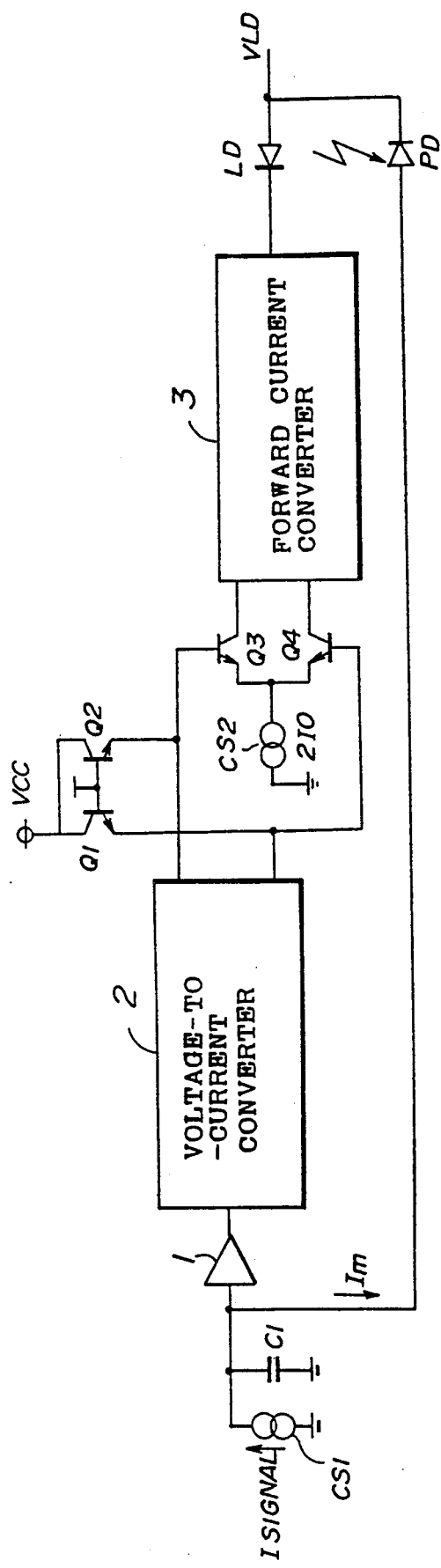
FIG. 1 shows a block diagram of an optical-electronic negative feedback used for a semiconductor laser controller of a first embodiment according to the present invention.

A semiconductor laser controller according to the present invention comprises, as shown in FIG. 1, a high-impedance circuit 1, a voltage-to-current converter 2, a forward current converter 3, a semiconductor laser (LD), a light-receiving element (PD), bipolar transistors $Q_1$ to $Q_4$, a capacitor (Cf), a source voltage (Vcc), and constant current sources $CS_1$ and $CS_2$. The semiconductor laser controller according to the present invention controls an optical output of the semiconductor laser (LD) by an optical-electronic negative feedback loop comprising the above components.

The light-receiving element (PD) is optically connected to the semiconductor laser (LD) so as to receive the optical output of the semiconductor laser (LD). An input terminal of the high-impedance circuit 1 is connected to the capacitor (Cf), the light-receiving element (PD), and the constant current source $CS_1$. An input terminal of the voltage-to-current converter 2 is connected to an output terminal of the high-impedance circuit 1. Collectors of the transistors $Q_1$ and $Q_2$ are connected to the voltage supply (Vcc). Respective bases of the transistors $Q_1$ and $Q_2$ are connected to each other so that they can be kept at the same potential. An emitter of the transistor $Q_1$ is connected to one output terminal of the voltage-to-current converter 2 and a base of the transistor $Q_4$. An emitter of the transistor $Q_2$ is connected to another output terminal of the voltage-to-current converter 2 and a base of the transistor $Q_3$. Both emitters of the transistors $Q_3$ and $Q_4$ are coupled to the constant current source $CS_2$. Both collectors of the transistors $Q_3$ and $Q_4$ are connected to the input terminals of the forward current converter 3. An output terminal of the forward current converter 3 is connected to the semiconductor laser (LD).

The semiconductor laser (LD), which is a controlled object, functions as a light source in a laser printer, etc.

The light-receiving element (PD), which is a converting part, receives the optical output $P_0$ of the semiconductor laser (LD), and outputs light current Im proportional to the optical output $P_0$, to the capacitor (Cf). The light-receiving element (PD) may be comprised of a photodiode.

The constant current source $CS_1$ supplies constant current Isignal to the capacitor (Cf). The constant current Isignal determines a desired optical output of the semiconductor laser (LD), and thus it is referred to as a power-setting current.

The high-impedance circuit 1 amplifies voltage between terminals of the capacitor (Cf) which voltage is caused by the light current Im.

The voltage-to-current converter 2 converts the amplified voltage of the capacitor (Cf) into current corresponding thereto to control the bipolar transistors $Q_1$ to $Q_4$.

The transistors $Q_1$ to $Q_4$ transmit information about the voltage change of the capacitor (Cf) to the forward current converter 3.

The constant current source $CS_2$ supplies constant current $2I_0$ to respective emitters of the transistors $Q_3$ and $Q_4$.

The forward current converter 3 converts the collector current of each of the transistors $Q_3$ and $Q_4$ into the forward current of the semiconductor laser (LD) to supply it thereto.

Incidentally, if the optical output $P_0$ is a desired optical output defined by the power-setting current Isignal, the emitter-current of the transistor $Q_1$ and that of the transistor $Q_2$ become respectively bias current $I_1$, while the emitter-current of the transistor $Q_3$ and that of the transistor $Q_4$ become respectively bias current $I_0$. However, if the optical output $P_0$ is not a desired optical output, the emitter-current of the transistor $Q_1$ becomes $I_1+I_{E1}$ and that of the transistor $Q_2$ becomes $I_1-I_{E1}$, while the emitter-current of the transistor $Q_3$ becomes $I_0+I_{E3}$ and that of the transistor $Q_4$ becomes $I_0-I_{E3}$.

Next follows a description of the operation of the semiconductor laser controller according to the present invention. When the light-receiving element (PD) generates the light current Im proportional to the optical output $P_0$ which is not the desired optical output, a voltage $V_1$ between the terminals of the capacitor (Cf) changes due to a change of the current Im which flows through the capacitor (Cf) since the current Im flows through the capacitor (Cf) in a direction reverse to that of the current Isignal. The capacitor (Cf) eventually receives current Isignal-Im and the current changes the voltage $V_1$. The voltage $V_1$ is amplified by the high-impedance circuit 1, and then input to the voltage-to-current converter 2. Thus, the emitter current of the transistor $Q_1$ becomes $I_1+I_{E1}$ and that of the transistor $Q_2$ becomes $I_1-I_{E1}$ while the emitter current of the transistor $Q_3$ becomes $I_0+I_{E3}$ and that of the transistor $Q_4$ becomes $I_0-I_{E3}$. In addition, base-emitter currents $V_{BE1}$ and $V_{BE2}$ of the respective transistors $Q_1$ and $Q_2$ are respectively defined as follows:

$$V_{BE1}=V_T \ln(I_1+I_{E1})-V_T \ln(I_{S1}); \text{ and}$$

$$V_{BE2}=V_T \ln(I_1-I_{E1})-V_T \ln(I_{S1})$$

On the other hand, base-emitter currents $V_{BE3}$ and $V_{BE4}$ of the respective transistors $Q_3$ and $Q_4$ are respectively defined as follows:

$$V_{BE3}=V_T \ln(I_0+I_{E3})-V_T \ln(I_{S2}); \text{ and}$$

$$V_{BE4}=V_T \ln(I_0-I_{E3})-V_T \ln(I_{S2})$$

On the other hand, since the emitter of the transistor $Q_1$ is connected to the base of the transistor $Q_4$ while the emitter of the transistor $Q_2$ is connected to the base of the transistor $Q_3$, the base-emitter potential difference between the transistors $Q_1$ and $Q_2$ is equal to that between the transistors $Q_3$ and $Q_4$. Consequently, $$V_{BE1}-V_{BE2}=V_{BE4}-V_{BE3}; \text{ and}$$

$$I_{E3}=(I_0/I_1) \cdot I_{E1}$$

Since the voltage $V_1$ is proportional to the current $I_{E1}$ with a proportional coefficient $A_0$, the above equation leads to the following equation:

$$I_{E3} = (o/I_1) \cdot A_0 \cdot V_1$$

Thus, a change of the emitter current of each of the transistors $Q_3$ and $Q_4$ is proportional to the voltage $V_1$. On the other hand, if respective current amplification factors of the transistors $Q_3$ and $Q_4$ are sufficiently large, the emitter-current of each of the transistors $Q_3$ and $Q_4$ can be regarded as the collector-current thereof. Thus, the collector-current of each of the transistors $Q_3$ and $Q_4$ is proportional to the voltage $V_1$ of the terminals of the capacitor (Cf). The collector-current of each of the transistors $Q_3$ and $Q_4$ are then converted into the forward current and supplied to the semiconductor laser (LD) by the forward current converter 3.

The light current Im relates to the optical output $P_0$ of the semiconductor laser as follows:

$$P_0 = \eta[(I_0/I_1) \cdot A_1 \cdot A_0 \cdot V_1 - I_{th}]$$

$$Im = \alpha \cdot S \cdot \eta[(I_0/I_1) \cdot A_1 \cdot A_0 \cdot V_1 - I_{th}]$$

where $A_1$ represents a coefficient of the converter 3, Ith represents threshold current of the semiconductor laser (LD), $\eta$ represents a differential quantum efficiency, $\alpha$ represents a joint-coefficiency of the light-receiving element (PD), and S represents a radiation sensitivity of the light-receiving element (PD).

During a DC operation, the voltage $V_1$ is defined as follows:

$$V_1 = R \cdot (I\text{signal} - Im)$$

where R represents a resistor located parallel to and equivalent to the capacitor (Cf), and thus, $$P_0 = \eta\{[(I_0/I_1) \cdot A_i \cdot A_0 \cdot R \cdot I\text{signal}] - I_{th}\} / [1 + \alpha \cdot S \cdot \eta \cdot (I_0/I_1) \cdot A_1 \cdot A_0 \cdot R]$$

Hereupon, if $R = 50(k\Omega)$, $\eta = 0.15(mW/mA)$, $\alpha \cdot S = 0.133(mA/mW)$, $A_0 = 2$, $A_1 = 1/6.8(\Omega)$, $I_0/I_1 = 10$, and Ith = 50(mA), $$\alpha \cdot S \cdot \eta \cdot (I_0/I_1) \cdot A_1 \cdot A_0 \cdot R \div 3000 >> 1$$

$$I_{th}(I_0/I_1) \cdot A_1 \cdot A_0 \cdot R = 0.34\mu A = 3 \mu W$$

Thus, if $P_0$ has a standard output level of about 1 wW, $P_0$ is proportional to Isignal as follows:

$$P_0 = I\text{signal}/\alpha \cdot S$$

On the other hand, during an AC operation, the voltage $V_1$ is defined as follows:

$$V_1 = (P\text{signal} - Im)/j\omega Cf,$$

while a gain Gv in a case where the optical-electronic negative feedback loop is open defined as follows:

$$Gv = \alpha \cdot S \cdot \eta \cdot (I_0/I_1) \cdot A_1 \cdot A_0/(j\omega Cf)$$

Due to the following reasons, phase lags in a circuit operation of the semiconductor laser controller can be remarkably reduced:

1) Since the light current Im is compared with the power-setting current Isignal by charging/discharging the capacitor (Cf), all phase lag factors except a phase lag factor caused by $j\omega Cf$ can be prevented.

2) The high-impedance circuit 1 can be made highly responsive if it is constructed of a transistor whose collector is grounded, since it can actuate at a frequency approximate to the cut-off frequency of the transistor.

3) The voltage-to-current converter 2 can be made highly responsive if it is constructed of a transistor in which a resistor is added to the emitter thereof so as to extract the collector-current.

4) If only about 100 $\mu A$ of bias current flows through the transistors $Q_1$ and $Q_2$, an emitter resistance becomes about 300 $\Omega$, and the influence of the capacitor (Cf) can be remarkably reduced.

Therefore, if a frequency is about 200 while a gain in a case where the optical-electronic negative feedback loop is open is 1, the above equation concerning Gv can be completely established.

If $\alpha \cdot S \cdot \eta \cdot (I_0/I_1) \cdot A_0$ becomes constant, the frequency can be determined by the proportional coefficient $A_1$ and the capacitance value of the capacitor (Cf) while the gain in a case where the optical-electronic negative feedback loop is open is constant. However, values of $\alpha \cdot S \cdot \eta$ vary in each semiconductor laser. Accordingly, if an attempt is made to construct a semiconductor laser controller made of an integrated circuit (IC), an additional component which corrects the variation in the values of S among the semiconductor lasers is needed. In addition, values of the proportional coefficient $A_1$ and the capacitor (Cf) cannot be properly determined in an IC since characteristics of components among ICs are quite different from each other. This problem can be solved by determining the proportional coefficient $A_1$ and the capacitor (Cf) by an additional component.

Figure 2:
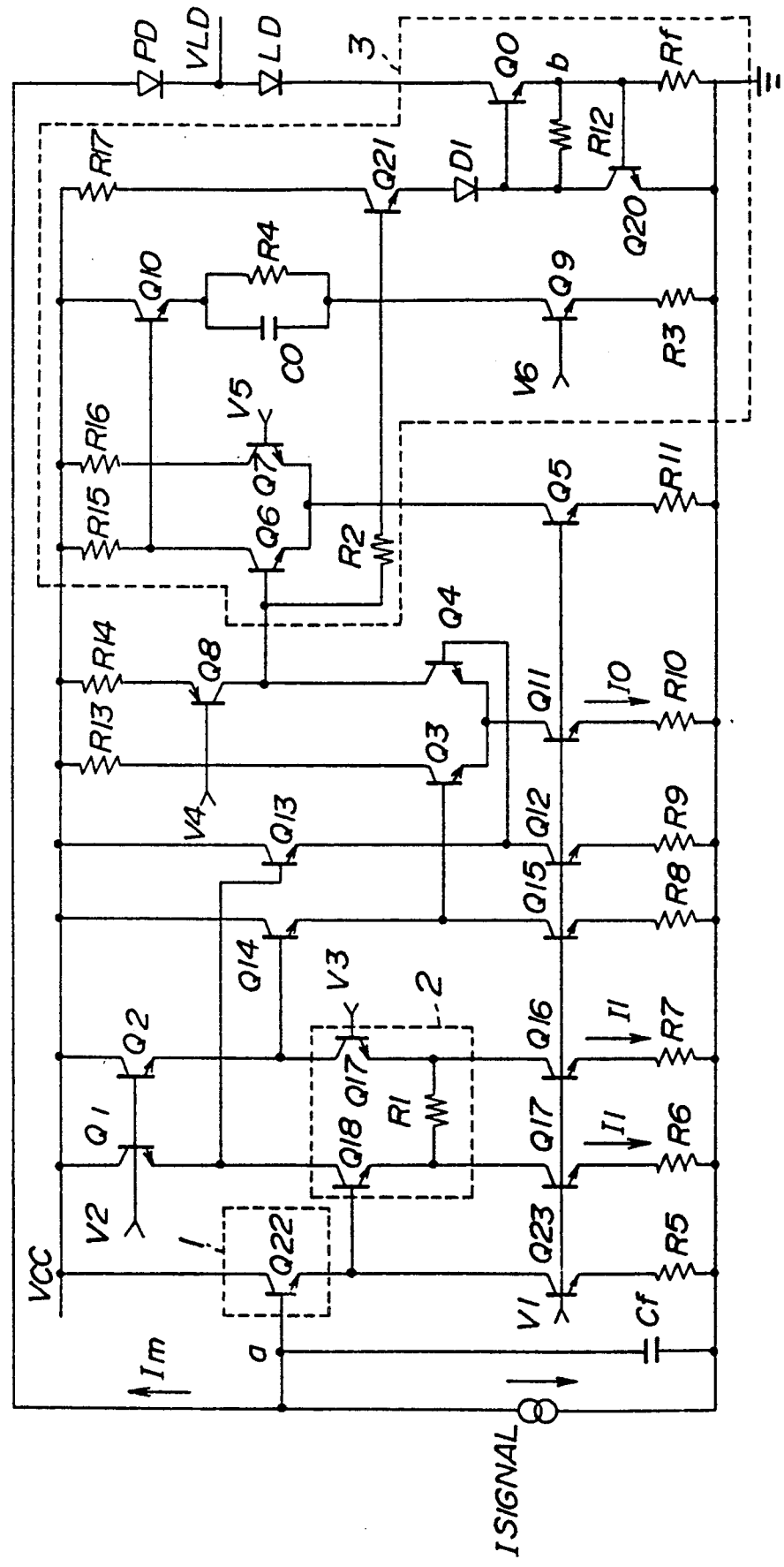
FIG. 2 shows a circuitry construction of the optical-electronic negative feedback shown in FIG. 1.

FIG. 2 shows a circuitry construction of the optical-electronic negative feedback loop shown in FIG. 1. Those elements shown in FIG. 2 which are the same as corresponding elements shown in FIG. 1 are designated by the same reference numerals, and a description thereof will be omitted.

In this case, bias current flows through $Q_{14}$ and $Q_{13}$ so that the voltage drops at the transistors $Q_{14}$ and $Q_{13}$ are equal to each other. The collector-current of the transistor $Q_9$ is converted into voltage by the resistor $R_2$ to become the base voltage of the transistor $Q_{21}$. Hereupon, the voltage-to-current conversion is performed by DC-shifting via the transistors $Q_6$, $Q_7$ and $Q_{10}$, resistor $R_4$, and capacitance $C_0$. The base-voltage of the transistor $Q_{21}$ is DC-shifted and then becomes the emitter-voltage of the transistor $Q_0$.

As a result, current determined by the emitter-voltage of the transistor $Q_0$ and the resistance value of a resistor Rf flows through the resistor Rf. Since the current amplifier ratio of the transistor $Q_0$ is sufficiently large, the emitter-current of the transistor $Q_0$ is equal to the collector-current of the transistor $Q_0$ and the forward current of the semiconductor laser (LD) is controlled. Hereupon, since $A_1$ denotes 1/Rf, the resistor Rf may be constructed, of an additional component when the optical-electronic feedback loop circuit is constructed as an IC.

Figure 3:
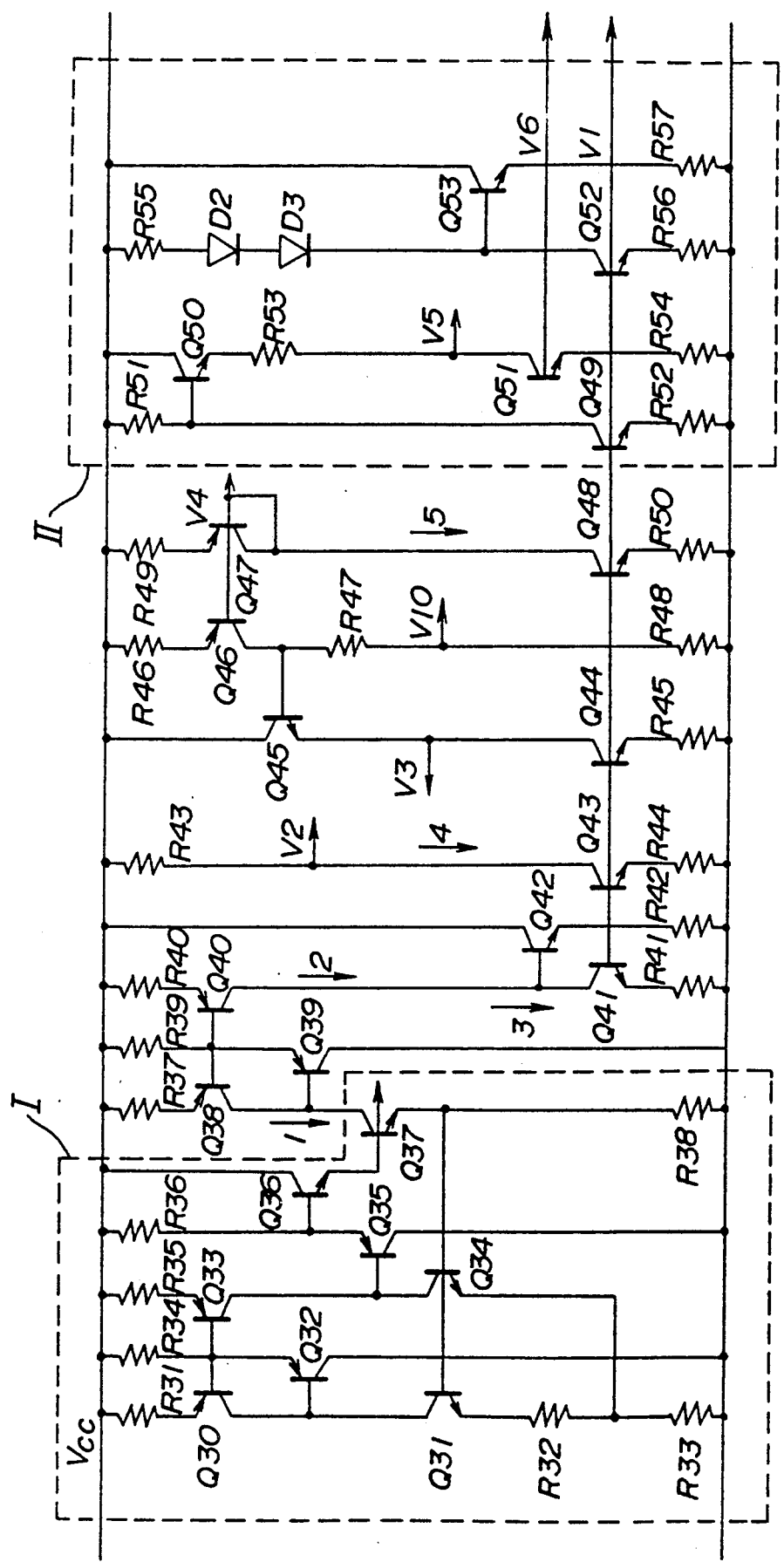
FIG. 3 shows a bias circuit used for the optical-electronic negative feedback shown in FIG. 2.

FIG. 3 shows a circuitry construction of a bias circuit. A description will now be given of the operation of the bias circuit. Part I generates a reference voltage indifferent to a change in the temperature. That is, the reference voltage is obtained between the resistor $R_{38}$ and an emitter of the transistor $Q_{37}$. Thus, current flowing through the resistor R38 becomes stable. A collector of the transistor Q37 is connected to a current mirror circuit comprising transistors Q38, Q39 and Q40. Arrows 1 to 5 respectively indicate current directions.

Transistors $Q_{41}$, $Q_{42}$ and $Q_{43}$ construct a current mirror circuit. The voltage $V_2$ is used to apply the constant voltage to the transistor $Q_{43}$, and voltage $V_2$ can be obtained by the voltage drop of the source voltage (Vcc) at a resistor $R_{43}$. In addition, since voltage equal to the base-voltage of the transistor $Q_{43}$ is applied to the transistor $Q_{48}$, current indicated by the arrow 5 flows through a collector of the transistor $Q_{48}$. Stable base-voltage $V_4$ is generated at a current mirror including the transistor $Q_{47}$.

When base-voltage $V_4$ is applied to a transistor $Q_{46}$, base-voltage of the transistor $Q_{45}$ can be stable. Voltage $V_3$ is generated between the emitter of the transistor $Q_{45}$ and the collector of the transistor $Q_{44}$. The voltage $V_3$ is a potential equal to the point "a" in FIG. 2, and thus stable. In part II, stable voltage $V_5$ and $V_6$ can be generated.

Figure 4:
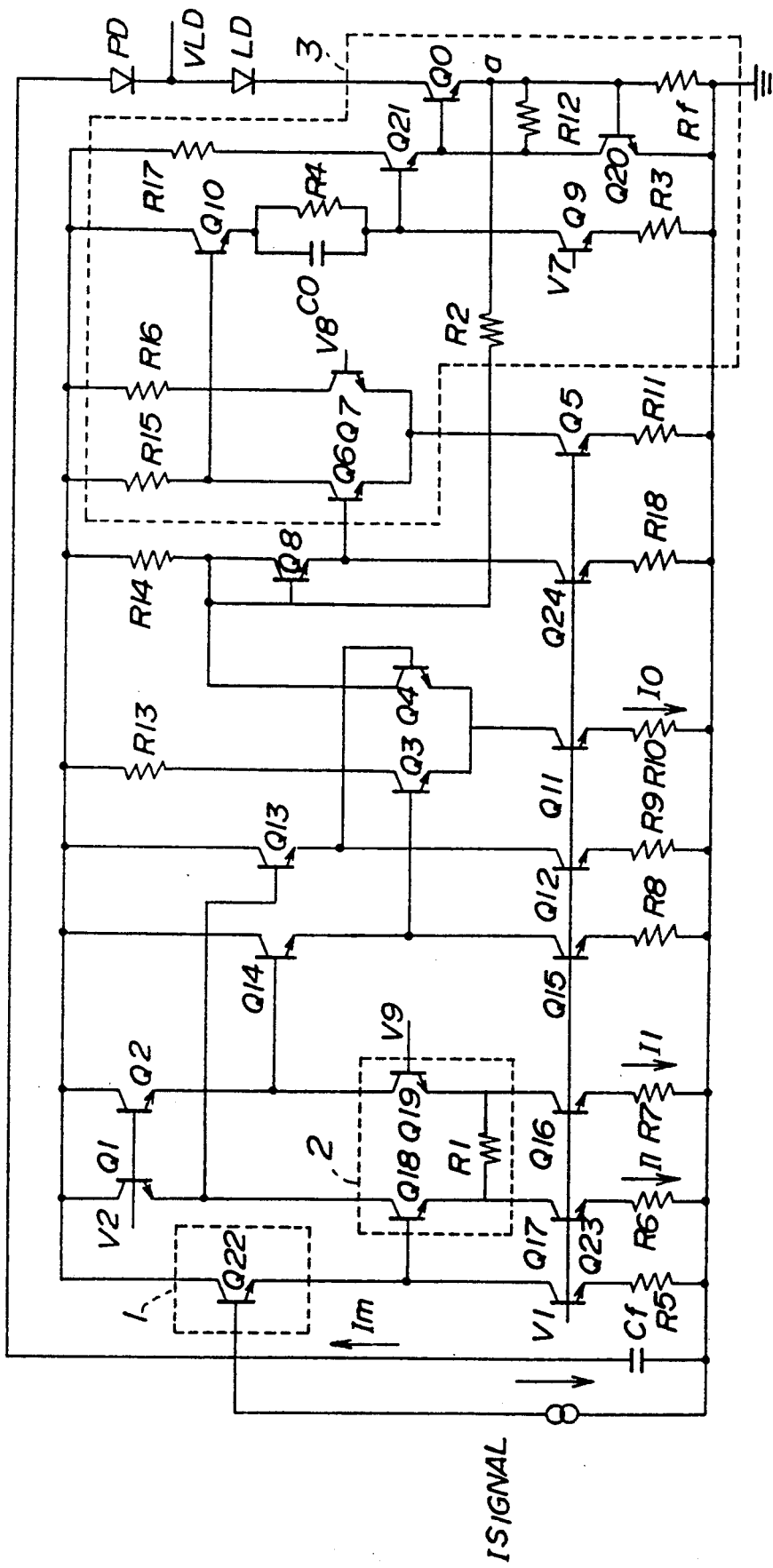
FIG. 4 shows a block diagram of an optical-electronic negative feedback used for a semiconductor laser controller of a second embodiment according to the, present invention.

FIG. 4 shows a block diagram of a semiconductor laser controller of a second embodiment according to the present invention. Those elements shown in FIG. 4 which are the same as corresponding elements shown in FIG. 2 are designated by the same reference numerals, and a description thereof will be omitted. FIG. 4 is different from FIG. 2 in the way connecting the resistor $R_2$. The semiconductor laser controller shown in FIG. 4 is superior to that shown in FIG. 2 in a linearity in a case where emitter-current of the driving transistor is small.

Figure 5:
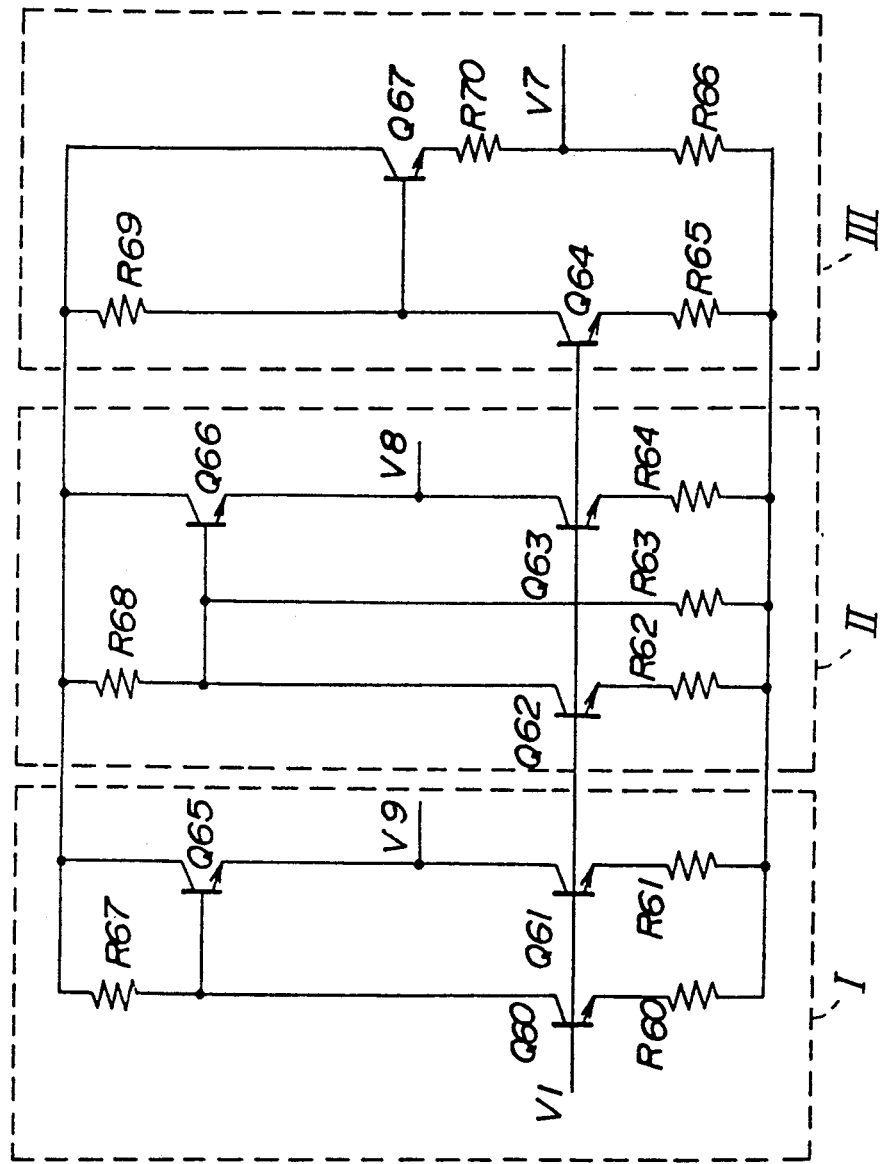
FIG. 5 shows a bias circuit used for the optical-electronic negative feedback shown in FIG. 4.

FIG. 5 shows a circuitry construction of a bias circuit shown in FIG. 4. Those elements shown in FIG. 5 which are the same as corresponding elements in FIG. 3 are designated by the same reference numerals, and a description thereof will be omitted. In part I, stable voltage $V_9$ indifferent to Vcc is generated. Voltage $V_7$ is applied to a base of the transistor $Q_9$ to apply stable voltage to the point "a" in FIG. 4.

Figure 6:
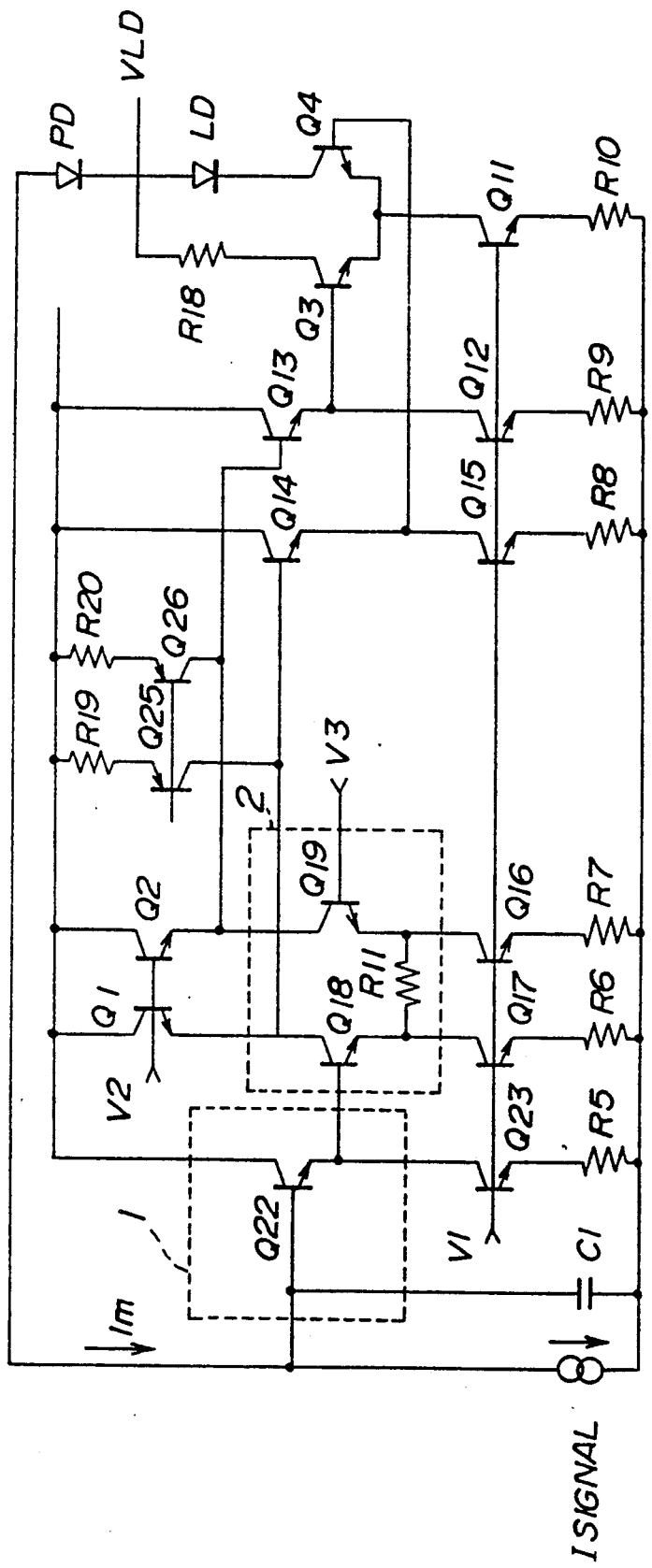
FIG. 6 shows a block diagram of an optical-electronic negative feedback used for a semiconductor laser controller of a third embodiment according to the present invention.

FIG. 6 shows a block diagram of a semiconductor laser controller of a third embodiment according to the present invention. In FIG. 6, the forward current converter 3 shown in FIG. 1 is omitted and the semiconductor laser (LD) is directly driven by the transistors $Q_3$ and $Q_4$ and thus an error current amplifier having a very fast optical-electronic negative feedback loop can be obtained. However, since the semiconductor laser controller shown in FIG. 6 is the fastest controller, the transistors $Q_9$ and $Q_{10}$ must become bulky.

Figure 7:
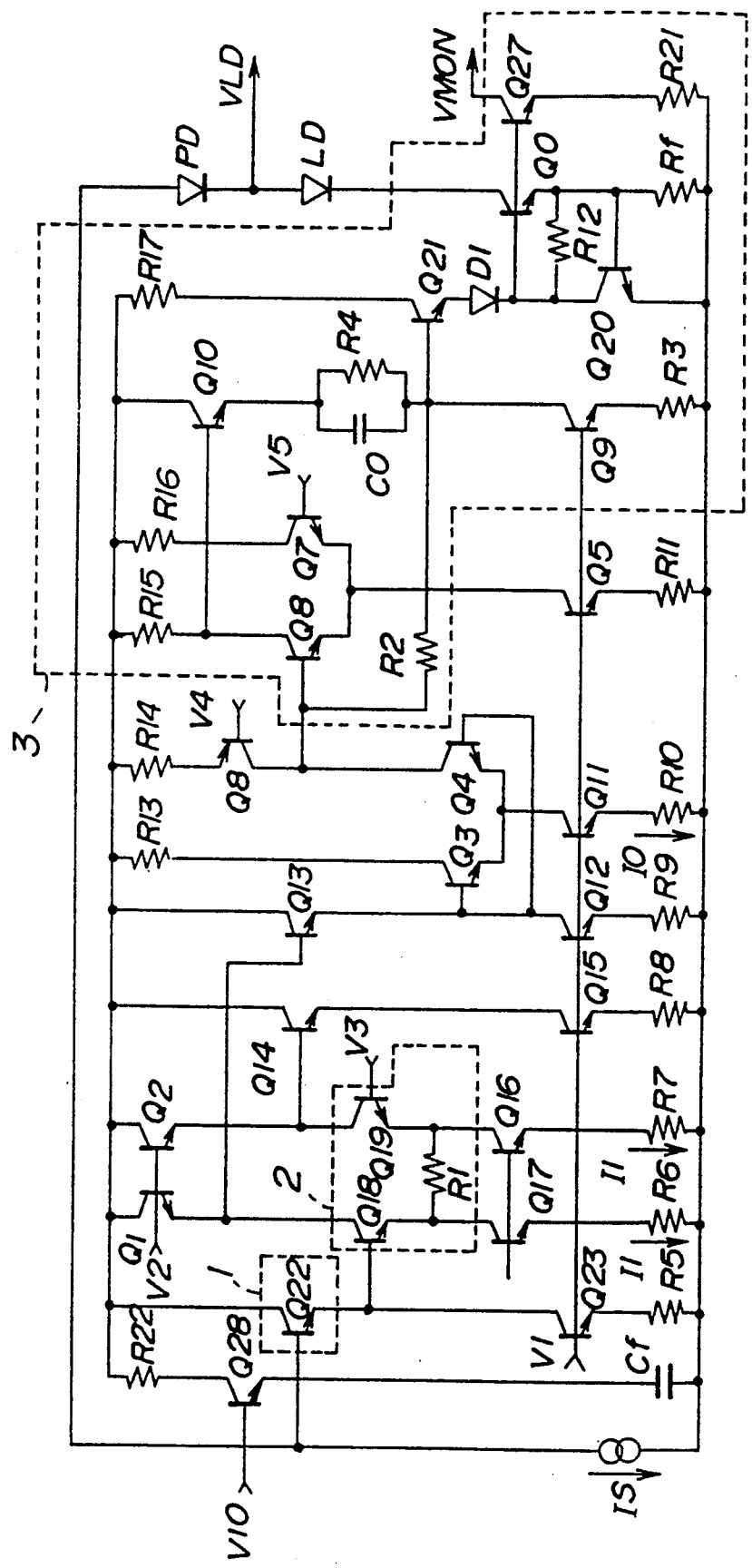
FIG. 7 shows a block diagram of an optical-electronic negative feedback used for a semiconductor laser controller of a fourth embodiment according to the present invention.

FIG. 7 shows a block diagram of a semiconductor laser controller of a fourth embodiment according to the present invention. In FIG. 7, base-voltage of the transistors $Q_{16}$ and $Q_{17}$ which supply bias current to transistors $Q_{18}$ and $Q_{19}$ shown in FIG. 2 is freely established. Thus, a DC gain in a case where the optical-electronic negative feedback loop is open can be determined. In addition, a ratio of $I_1/I_0$ can be adjusted, and a frequency can be set while the gain in a case where the optical-electronic negative feedback loop is open is 1. $V_{10}$ shown in FIG. 7 corresponds to that shown in FIG. 3, and a description thereof will be omitted.

Figure 8A:
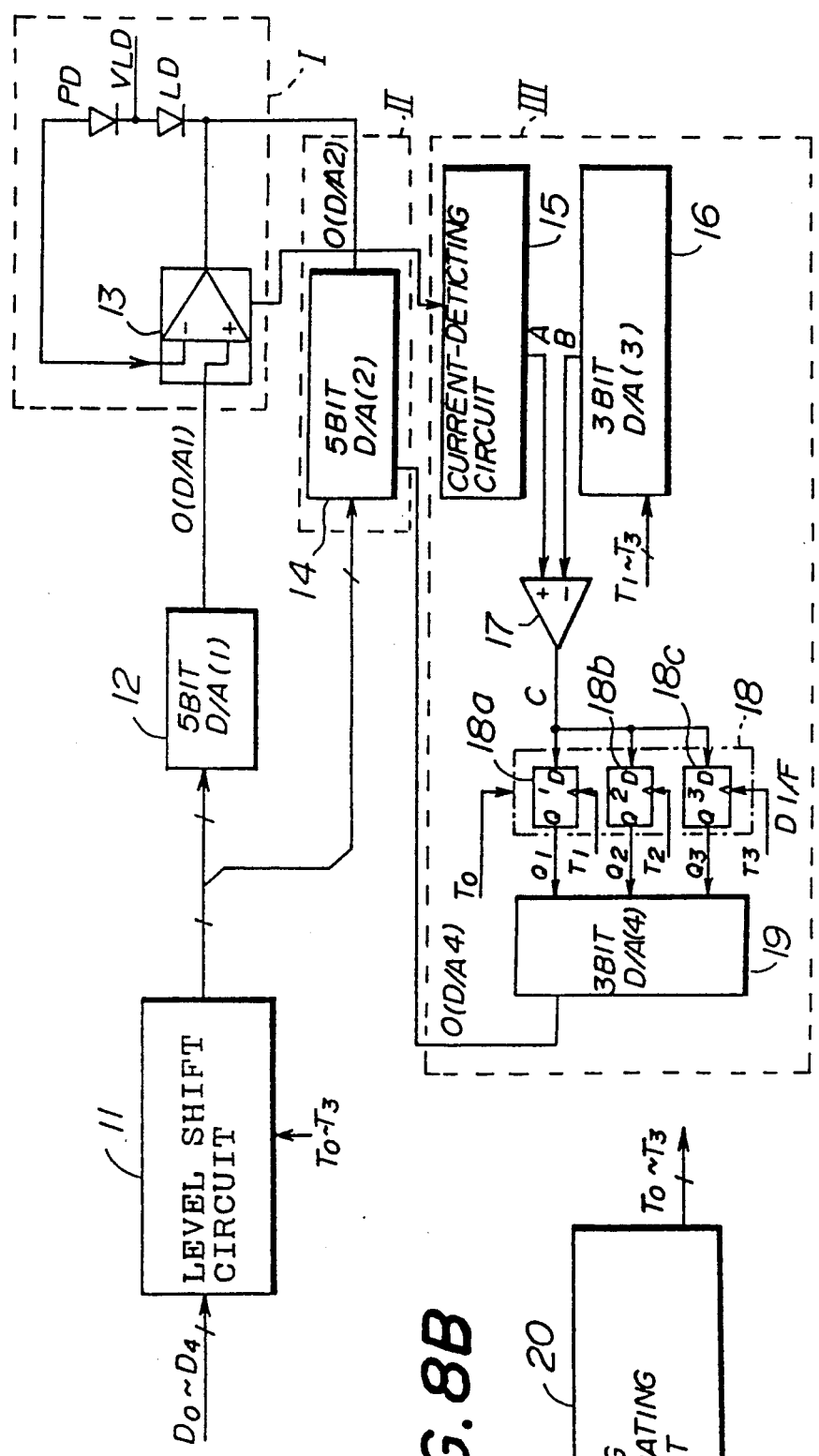
FIGS. 8A and 8B show a block diagram of a semiconductor laser controller of a fifth embodiment according to the present invention.
Figure 8B:
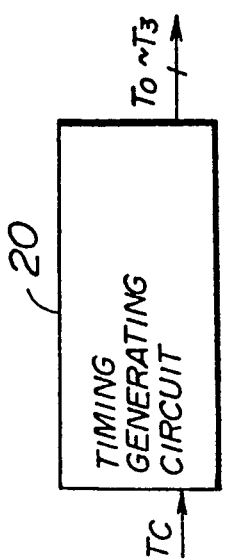

FIGS. 8A and 8B show a block diagram of the semiconductor laser controller of a fifth embodiment according to the present invention. Numeral 11 denotes a level shift circuit, numeral 12 denotes a 5-bit D/A converter (1), numeral 13 denotes a main amplifier, numeral 14 denotes 5-bit D/A converter (2), numeral 15 denotes a current-detecting circuit, numeral 16 denotes 3-bit D/A converter (3), numeral 17 denotes a comparator, numeral 18 denotes a D-type flip-flop (D-F/F), numeral 19 denotes a 3-bit D/A converter (4), and numeral 20 denotes a timing generating circuit. Incidentally, part I including the main amplifier 13 corresponds to the construction shown in FIG. 1. Part II is a driving circuit whereas part III is an automatic set circuit.

In FIGS. 8A and 8B, the driving circuit and the automatic set circuit are provided with the semiconductor laser controller, in addition to the optical-electronic negative feedback loop, in order to perform the fast direct modulation. The driving circuit drives the semiconductor laser (LD) by current proportional to the power-setting current. The automatic set circuit automatically determines a conversion ratio at which the power-setting current is converted into driving current for the semiconductor laser (LD).

Figure 9:
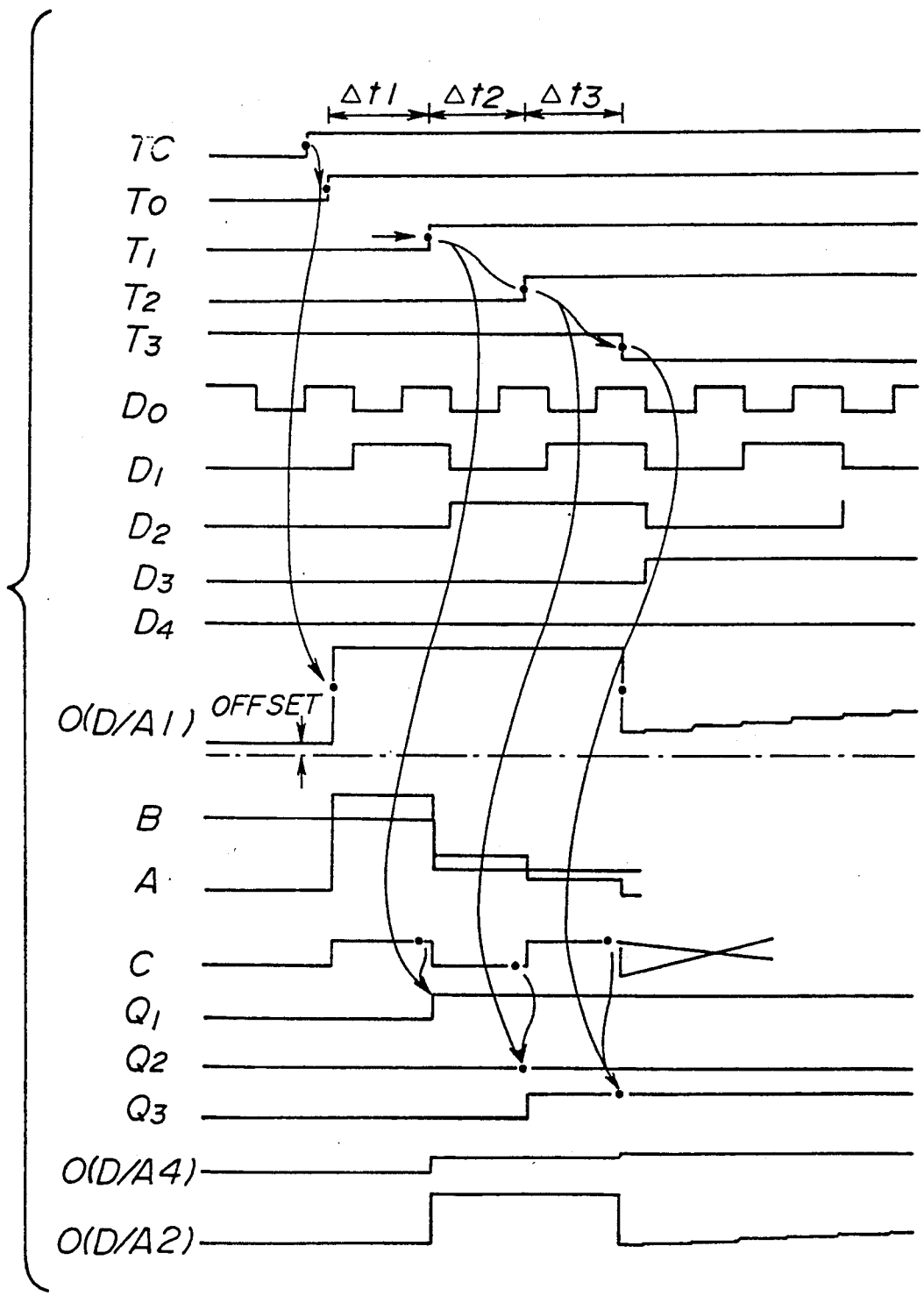
FIG. 9 shows a timing chart of the semiconductor laser controller shown in FIGS. 8A and 8B.

FIG. 9 shows a timing chart of an operation of the semiconductor laser controller shown in FIG. 8. Next follows a description of how the conversion ratio is determined. When TC is low level, all of the data is compulsorily made low level and outputs of the 5-bit D/A converters (1) and (2) are made the lowest level. In addition, $T_0$ to $T_3$ are made completely low level. After TC changes from low level to high level, $T_0$ changes from low level to high level and D-F/F 18 changes from clear mode to ready mode, the D-F/F 18 accepting an input clock during the ready mode. In addition, inputs of the 3-bit D/A converter (4) are completely low level and an output 0(D/A(4)) thereof becomes the lowest level. Moreover, an output of the 5-bit D/A converter (1), which is the power-setting current, becomes the lowest level, but, due to an offset, an optical output of the semiconductor laser (LD) does not become 0. Thus, the main amplifier 13 outputs current Iout1 corresponding to the offset of the power-setting current.

When TC is high level, all of the data is compulsorily made high level and outputs of the 5-bit D/A converters (1) and (2) are made the highest level. Then the main amplifier 13 outputs current Iout2 corresponding to the highest level of the power-setting current. The current-detecting circuit 15 outputs current A (=Iout-Iout1). On the other hand, the 3-bit D/A converter (3) outputs maximum current B. The comparator 17 compares the current A with the current B, and outputs a comparison result to the D-F/F 18. While $T_1$ is low level, the output of the D-F/F 18 is low level and the 5-bit D/A converter (2) controlled by the 3-bit D/A converter (4) outputs current corresponding to the minimum output of the 3-bit D/A converter (4). When $T_1$ becomes high level, the D-F/F 18a receives the comparison result from the comparator 17. When the output B of the 3-bit D/A converter (3) becomes half of that while $T_1$ is low level, the output 0(D/A (4)) of the 3-bit D/A converter (4) is changed by the output result of the D-F/F 18a and the output current of the 5-bit D/A converter (2) is changed, accordingly. Since the change speed of the current is made slower than the control speed of the optical-electronic negative feedback loop, the current of the main amplifier 13 changes so that the optical output of the semiconductor laser (LD) indifferent to an output of the 5-bit D/A converter (2) can change. Similar operations are performed for $T_2$ and $T_3$. After the D-F/F 18 receives input data, input data $D_0$ to $D_4$ are accepted by the level shift circuit 11. The above operation is performed so that the forward current of the semiconductor laser is sequentially converted from analog to digital via the optical-electronic negative feedback loop having an optical output corresponding to a change of the power-setting current. The full-scale of the 5-bit D/A converter (2) is set so that a change of the optical current of the main amplifier 13 can be minimized. Since the 5-bit D/A converter (2) drives the semiconductor laser so that the optical output can be the desired level defined by the power-setting current, the control amount of the optical-electronic negative feedback loop can be decreased to contribute to the fast modulation. Incidentally, the number of bits of the D-F/F 18 is not limited to 3. In addition, another memory unit other than the D-F/F 18 may be used. Moreover, the power-setting current may be changed from the minimum level to the maximum level. Moreover, instead of using the 5-bit D/A converter (2) by which the semiconductor laser can be driven by current proportional to the power-setting current, a multiplier and external voltage may be used to change a full-scale.

Figure 10:
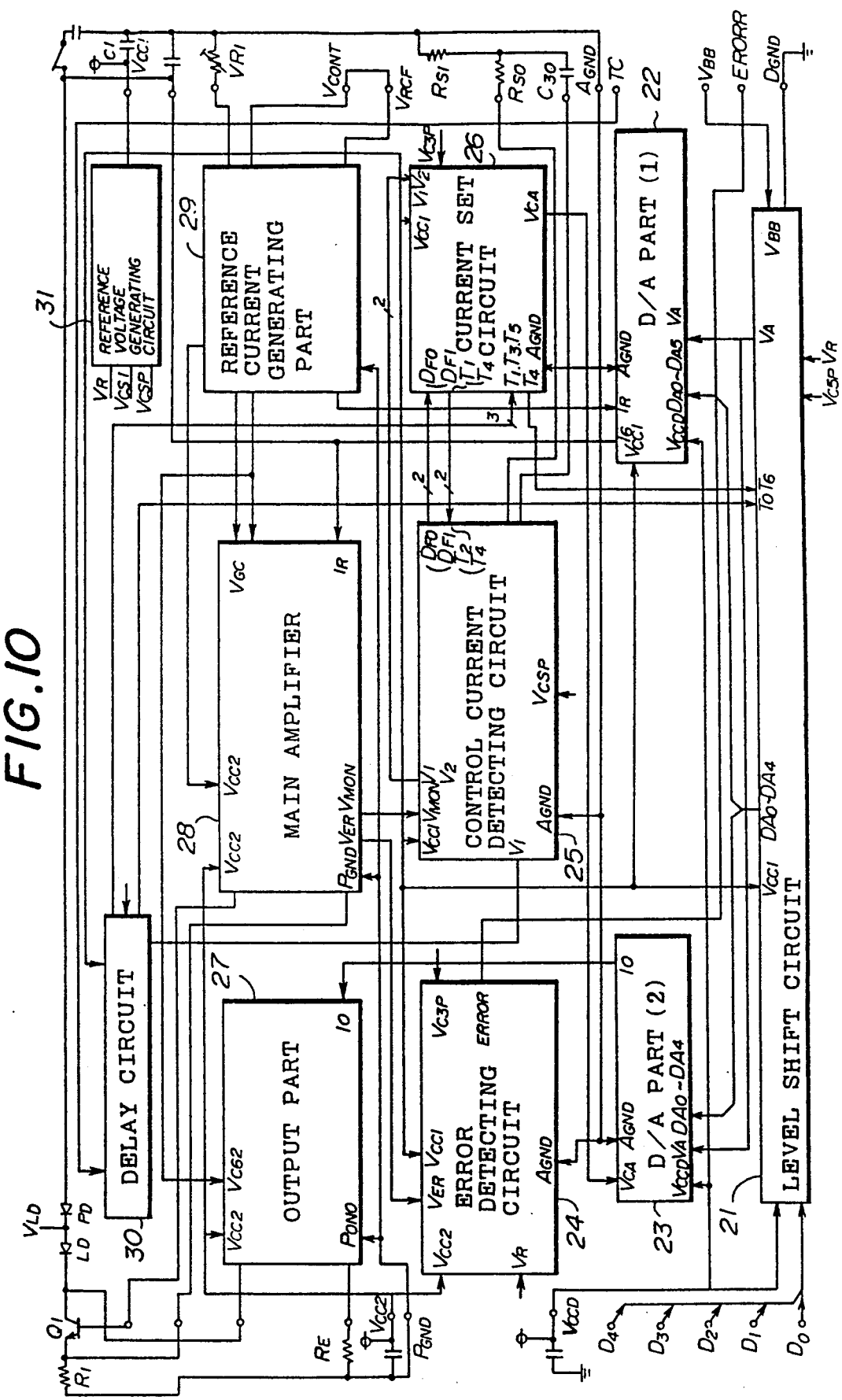
FIG. 10 shows a block diagram of a semiconductor laser controller of a sixth embodiment according to the present invention.

FIG. 10 shows a detailed block diagram of a semiconductor laser controller of a sixth embodiment according to the present invention. Numeral 21 shows a level shift circuit, numeral 22 denotes a D/A part (1) of an optical output setting circuit, numeral 23 denotes a D/A part (2) of a current adder, numeral 24 denotes an error detecting circuit, numeral 25 denotes a control current-detecting circuit, numeral 26 denotes a current set circuit, numeral 27 denotes an output part of a current adder, numeral 28 denotes a main amplifier, numeral 29 denotes a reference current generating part, numeral 30 denotes a delay circuit, and numeral 31 denotes a reference voltage generating circuit.

Next follows a description of an operation of the semiconductor laser controller shown in FIG. 10. Input data $D_0$ to $D_4$ are input to the level shift circuit 21 to be converted into internal logic levels by a slice level set by $V_{BB}$. If the control signal $T_0$ of the delay circuit 30 is high level and $T_6$ is low level, the level shift circuit 21 outputs a high-level internal logic signal. On the other hand, if the control signal $T_0$ is low level and $T_6$ is low level, the level shift circuit 21 outputs a low-level signal. Moreover, the level shift circuit 21 outputs slice volta $V_A$ which is a mid point of the output signal.

Output data $DA_0$ to $DA_4$ of the level shift circuit 21 and the slice level signal $V_A$ are input to the D/A part (1) of the optical output set circuit and D/A part (2) of the current adder. If the input data $DA_0$ to $DA_4$ are low level, the D/A part (1) outputs maximum current $I_s$ and the D/A part (2) outputs maximum current $I_0$. The full-scale of the output current $I_s$ of the D/A part (1) is defined by a signal $I_R$ transmitted from the reference current generating part 29. On the other hand, the full-scale of the output current $I_0$ of the D/A part (2) is defined by output voltage $V_{CA}$.

The output part 27 of the current adder amplifies the current $I_0$ transmitted from the D/A part (2) and drives the semiconductor laser (LD), the amplification factor being set by a resistance value of the resistor $R_E$. The additional resistor $R_E$ adjusts the maximum driving current to control driving of the semiconductor laser (LD).

The main amplifier 28 monitors the current $I_s$ of the D/A part (2) and the optical output of the semiconductor laser. Differential current between the light current and the power-setting current $I_s$ is input to Iin. Iin is amplified by driving the additional transistor $Q_1$, so as to control the forward current of the semiconductor laser (LD). The optical-electronic negative feedback loop comprises the main amplifier 28, semiconductor laser (LD), and photodiode (PD). A gain of the main amplifier 28 can be adjusted by the control signal $V_{GC}$ from the reference current generating part 29. Moreover, the monitor output $V_{MON}$ used to monitor the control current of the semiconductor laser and a protection circuit which protects circuits in a case where the control current becomes more than a predetermined current value are installed. When the protection circuit actuates, it outputs $V_{ER}$ to the error detecting circuit so that the error detecting circuit can find an error. By constructing the transistor for driving the semiconductor laser located at the final stage of the main amplifier 28, the emitter resistor Rf of the transistor, and the capacitance Cf which integrates the differential current between the output current of the photodiode (PD) and the power-setting current $I_s$, with additional components, the control speed of the optical-electronic negative feedback loop is stabilized and consumed power of the blocks shown in FIG. 10 except the transistor $Q_1$ can be reduced.

The control current detecting circuit 20 includes the current-detecting circuit 15, 3-bit D/A converter (3) and comparator 17. The comparison results $DF_0$ and $DF_1$ are output to the current set circuit 26. The error detecting circuit 24 compares $V_{ER}$ with the reference volta $V_{R1}$. If there is an error, the error detecting circuit 24 outputs an error signal.

When the current set circuit 26 receives outputs $DF_0$ and $DF_1$ from the control current detecting circuit 25, it holds the outputs $DF_0$ and $DF_1$ in accordance with timings $T_1$, $T_3$, and $T_5$ and outputs $V_{CA}$, based on the held data, which define the full-scale of the D/A part (2). In addition, after the data is held at a timing of $T_5$, the current set circuit 26 outputs the timing signal $T_6$ to the level shift circuit 21.

The reference current generating part 29 outputs the gain control signal $V_{GC}$ of the main amplifier 28 combined with the full-scale set current $I_R$ of the D/A part (1), based on the reference signal set by the additional resistor $VR_1$. Moreover, the full-scale of the D/A part (1) can be adjusted b $V_{CONT}$, indifferently to the gain control signal $V_{GC}$.

The delay circuit 30 outputs $T_0$, $T_1$, $T_3$ and $T_5$ which vary in accordance with the TC signal. The reference voltage generating circuit 31 generates reference voltage used for the blocks shown in FIG. 10. The level shift circuit 21, reference voltage generating circuit 31, main amplifier 28, and output part 27 of the current adder are configured so that they are separated from each other as far as possible.

Figure 11:
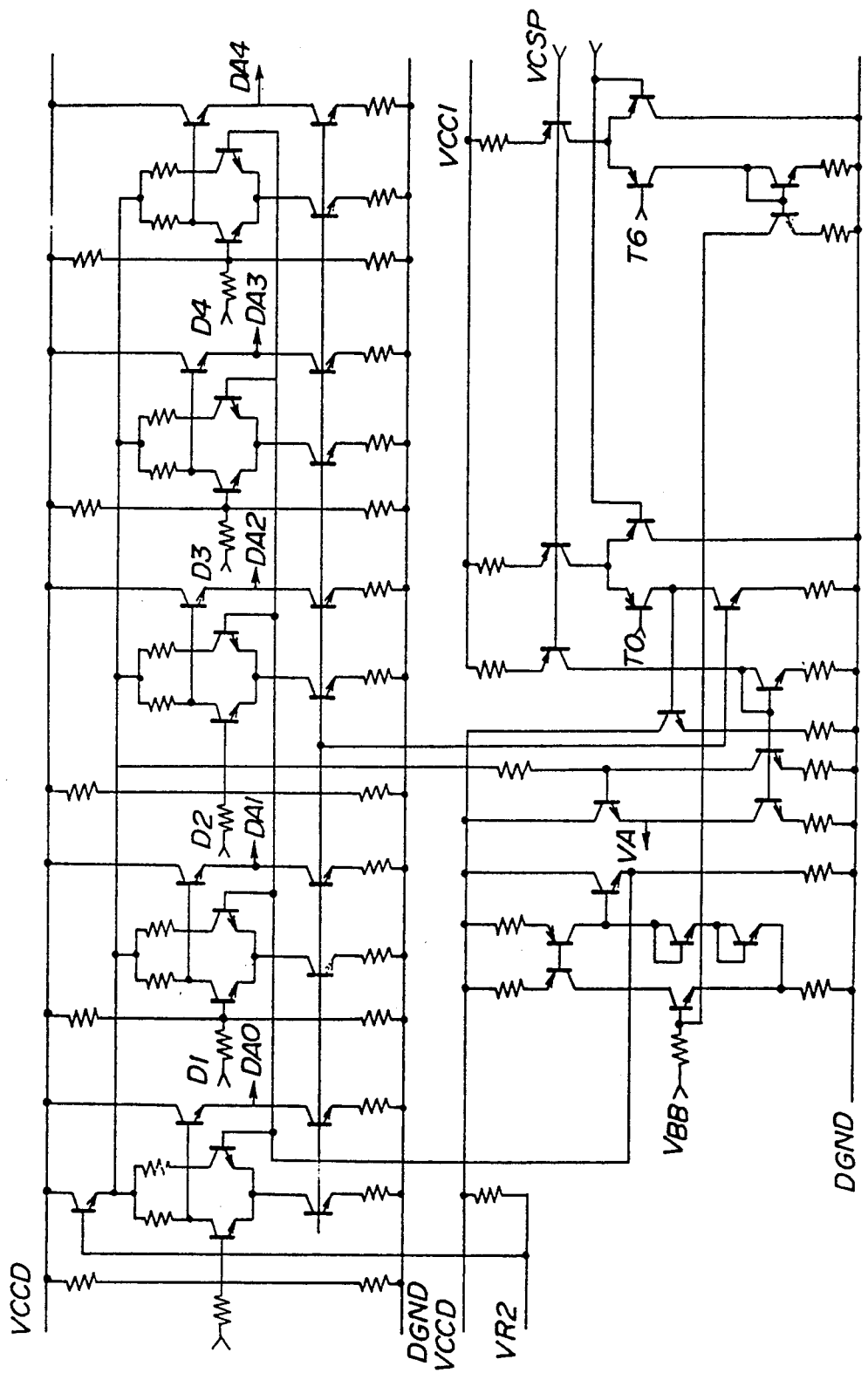
FIG. 11 shows a circuitry construction of a level shift circuit shown in FIG. 10.

FIG. 11 shows a circuitry construction of the level shift circuit. When $T_0$ is low level, bias current of the differential switch receiving $D_0$ to $D_4$ is 0 and $DA_0$ to $DA_4$ compulsorily become high level. On the other hand, when $T_6$ is low level, current is input from the input part of $V_{BB}$ to compulsorily make the slice level low level. Consequently, $DA_0$ to $DA_4$ become low level indifferent to the input data $D_0$ to $D_4$.

Figure 12:
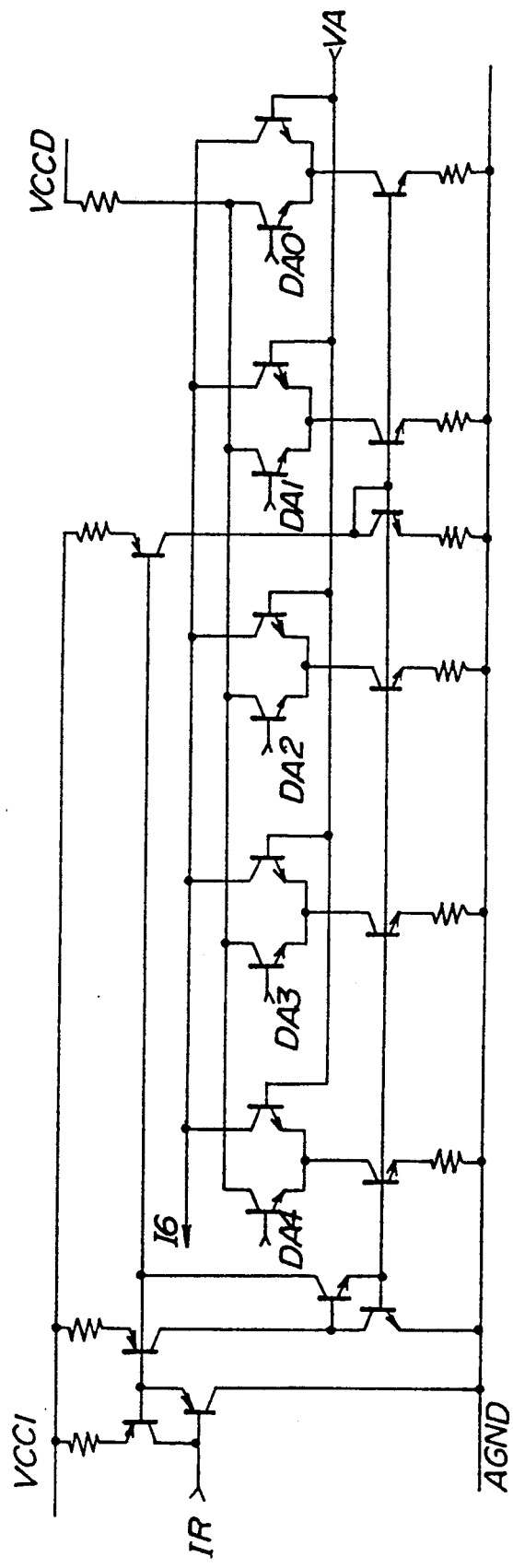
FIG. 12 shows a circuitry construction of a D/A part (1) of an optical output setting circuit shown in FIG. 10.

FIG. 12 shows a circuitry construction of the D/A part (1) of the optical output setting circuit which sets current values of the differential switches activated by input current $I_R$.

Figure 13:
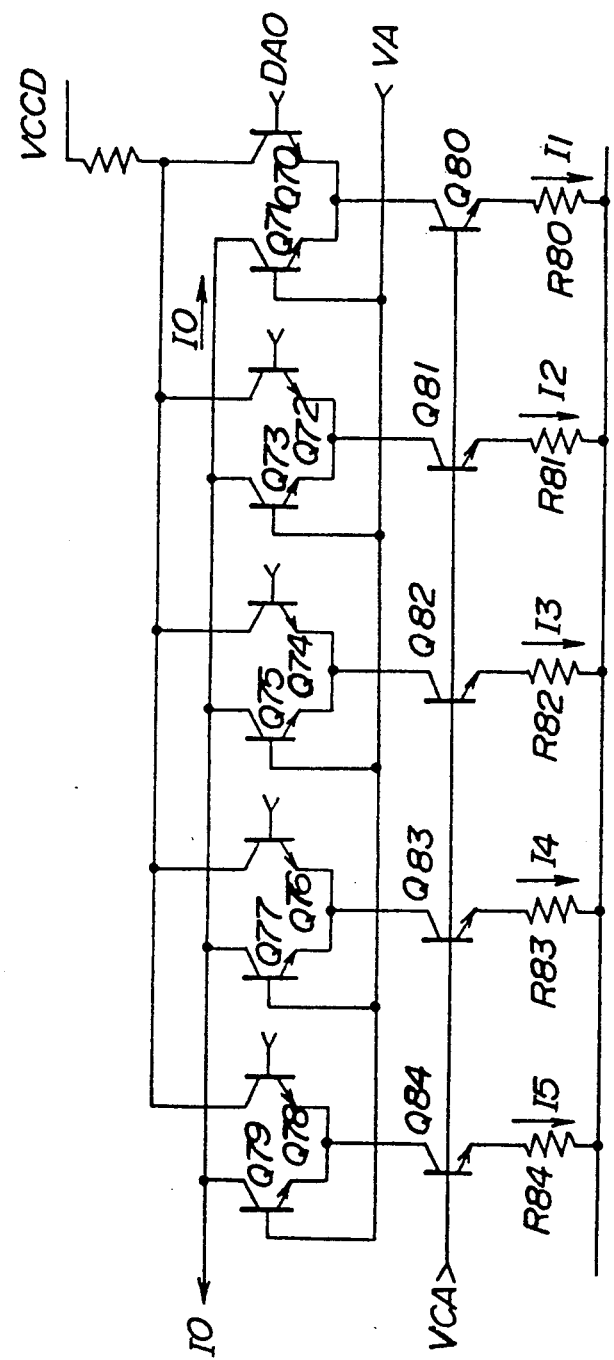
FIG. 13 shows a circuitry construction of a D/A part (2) of a current adder shown in FIG. 10.

FIG. 13 shows a circuitry construction of the D/A part (2) of the current adder. Transistors $Q_{70}$ to $Q_{79}$ indicate differential switches. If a size of a transistor $Q_{80}$ is called 1, that of a transistor $Q_{81}$ becomes 2, that of a transistor $Q_{82}$ becomes 4, that of a transistor $Q_{83}$ becomes 8, and that of a transistor $Q_{84}$ becomes 16. That is, $I_2=2I_1$, $I_3=4I_1$, $I_4=8I_1$, $I_5=16I_1$, where $I_1$ represents current flowing through the resistor $R_{80}$, $I_2$ represents current flowing through a resistor $R_{81}$, $I_3$ represents current flowing through a resistor $R_{82}$, $I_4$ represents current flowing through a resistor $R_{83}$, and $I_5$ represents current flowing through a resistor $R_{84}$.

When is low level, the current $I_0$ flows through the transistor $Q_{71}$ and the current $I_1$ consequently flows therethrough. If $DA_1$ is low level, the current $I_0$ flows through the transistor $Q_{73}$ and current $I_2$ consequently flows therethrough. Thus, the differential switches output additional current.

Figure 14:
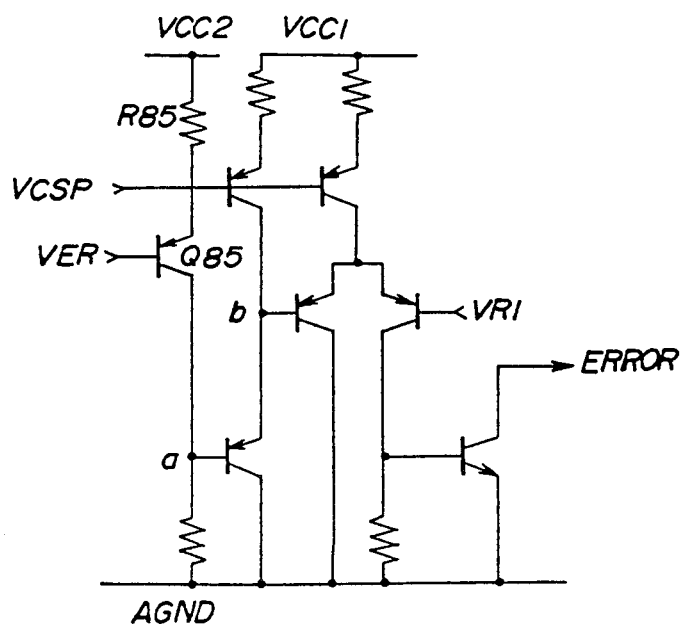
FIG. 14 shows a circuitry construction of an error detecting circuit shown in FIG. 10.

FIG. 14 shows a circuitry construction of the error detecting circuit. When voltage $V_{ER}$ is applied to a base of a transistor $Q_{85}$, corresponding voltage is generated, at the point "a", from the voltage drop of the voltage Vcc at a resistor $R_{85}$. If $V_{ER}=Vcc-V_B$, voltage $V_B$ is generated at the point "b". The error signal is generated by comparing $V_{R1}$ with $V_B$ and consequently $V_{R1}<V_B$.

Figure 15:
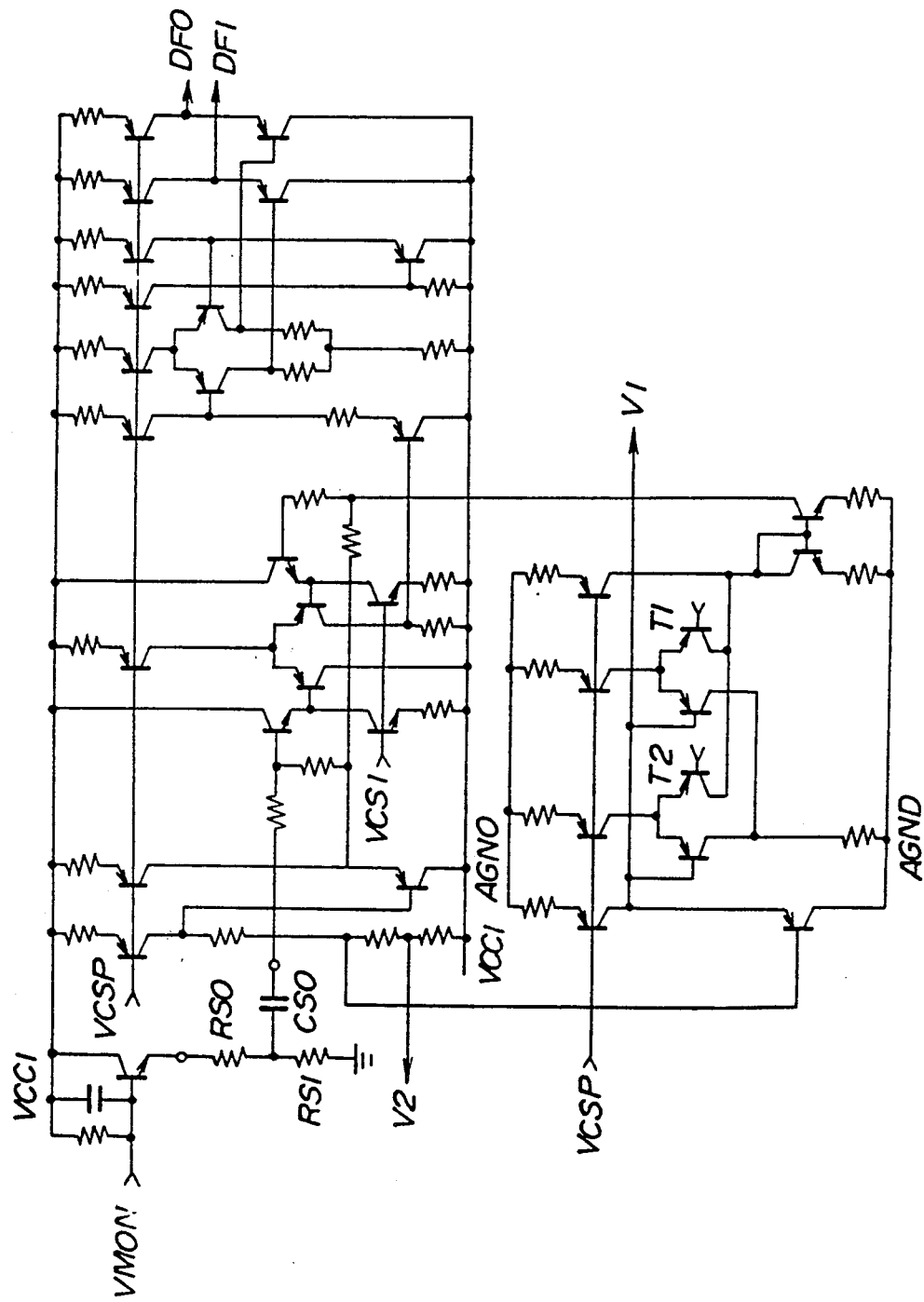
FIG. 15 shows a circuitry construction of a control current detecting circuit shown in FIG. 10.

FIG. 15 shows a circuitry construction of the control current detecting circuit. The $V_{MON}$ is divided by additional resistors $RS_0$ and $RS_1$ to vary a division ratio based on the kind of the semiconductor laser. In addition, the high-pass filter is made of an additional capacitor. Since much time passes from when $T_0$ becomes low level to when $T_6$ becomes high level, a change of the control current of the optical-electronic negative feedback loop, which corresponds to the change from the minimum level to the maximum level of the power-setting current, is detected while keeping the DC potential precision. Thus, a change of the control current can be detected by a simple circuit.

Figure 16:
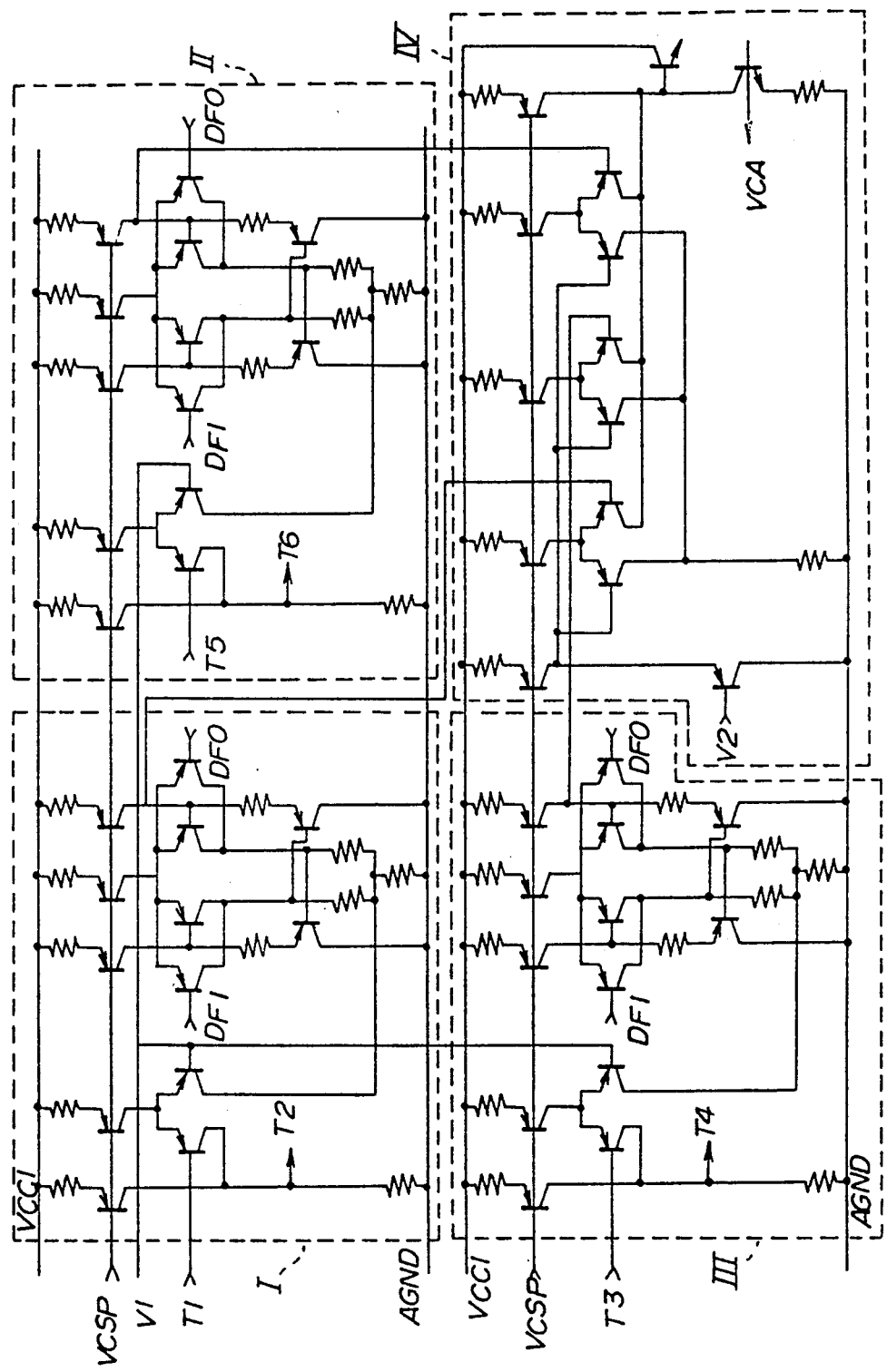
FIG. 16 shows a circuitry construction of a current set circuit shown in FIG. 10.

FIG. 16 shows a circuitry construction of the current setting circuit. Part I corresponds to the D-F/F 18a shown in FIG. 8, part II corresponds to the D-F/F 18c shown in FIG. 8, part III corresponds to the D-F/F 18b shown in FIG. 8, and part IV corresponds to the 3-bit D/A converter (4) shown in FIG. 8.

Figure 17:
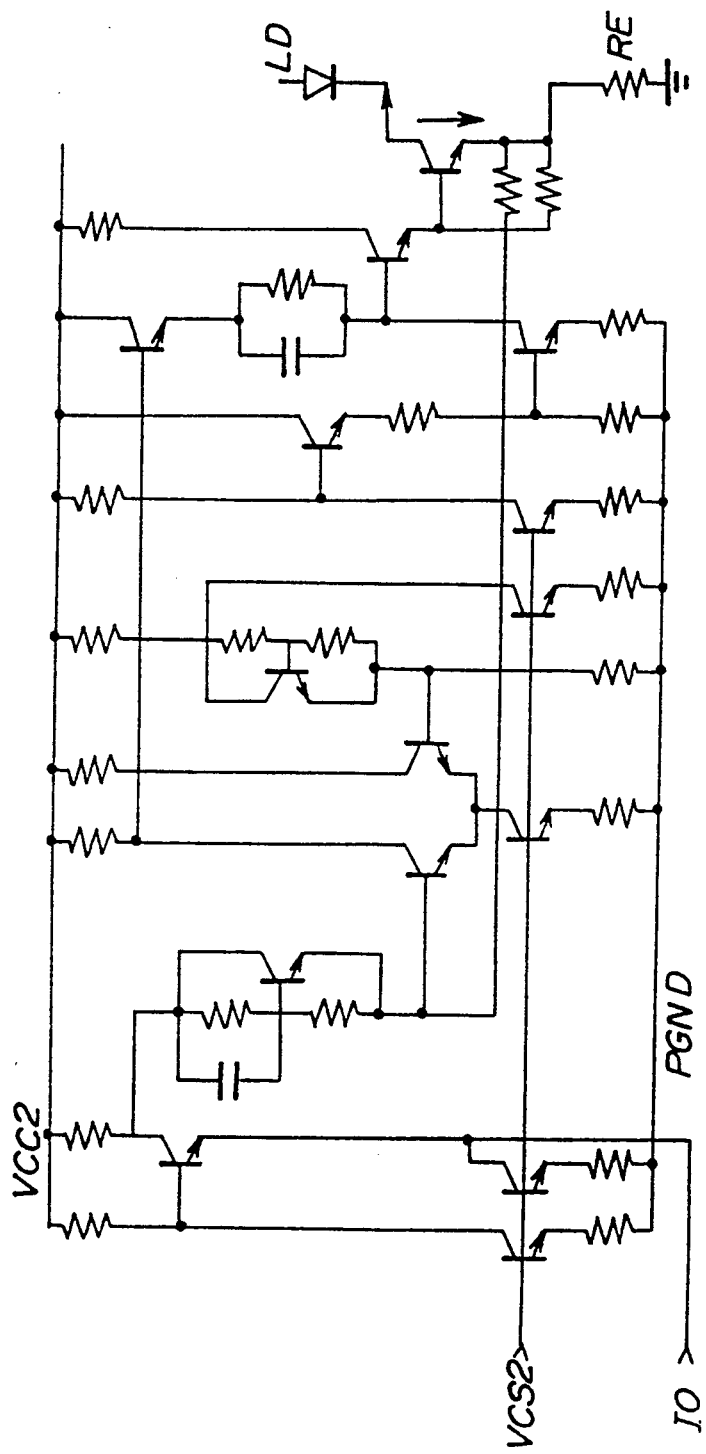
FIG. 17 shows a circuitry construction of an output part of the, current adder shown in FIG. 10.

FIG. 17 shows a circuitry construction of the output part of the current adder. Current generated by amplifying the current $I_0$ obtained at the D/A part (2) flows in a direction indicated by an arrow.

Figure 18:
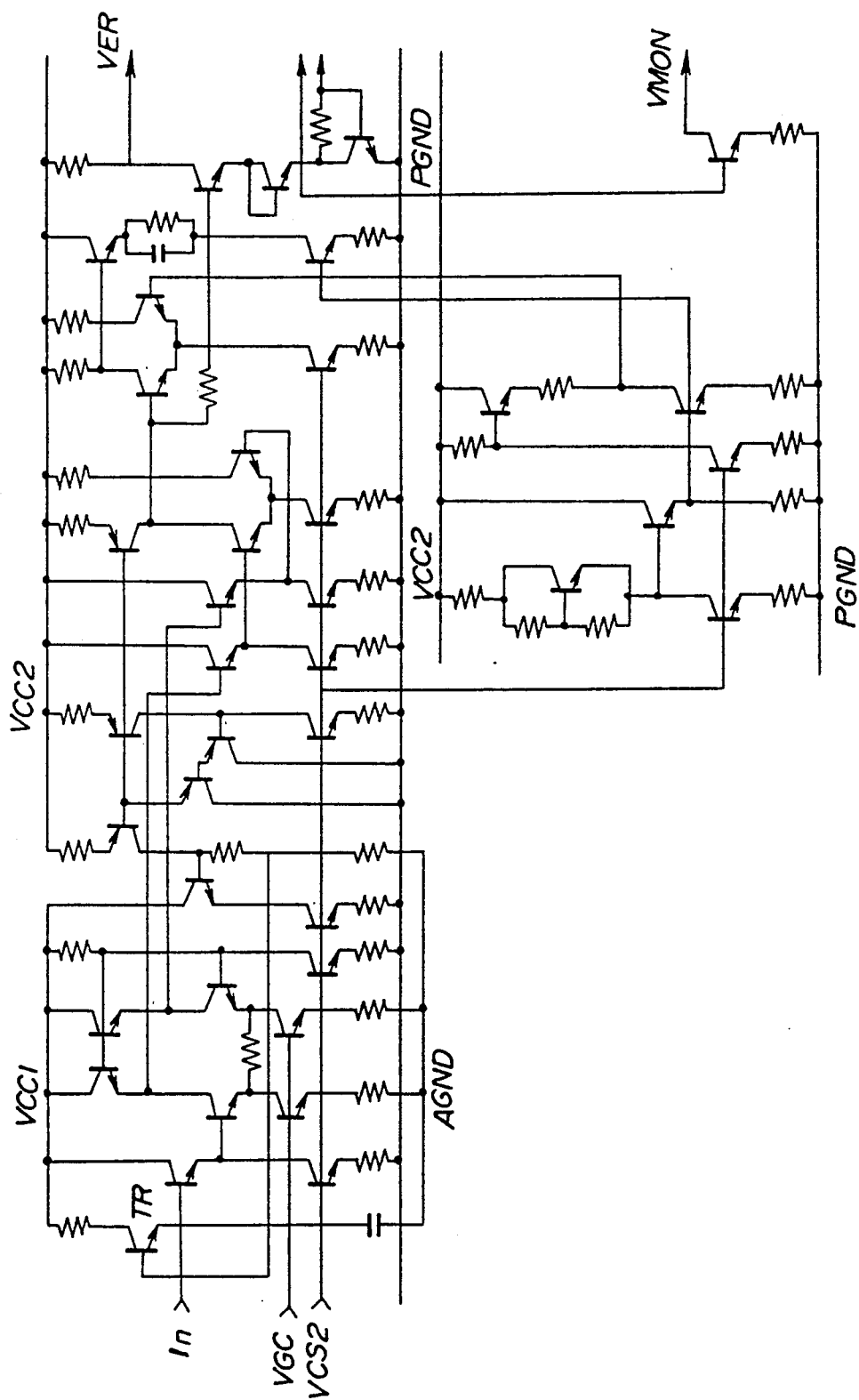
FIG. 18 shows a circuitry construction of a main amplifier shown in FIG. 10.

FIG. 18 shows a circuitry construction of the main amplifier. Since the semiconductor laser tends to get damaged by an excessive amount of current, the semiconductor laser is energized after the semiconductor laser controller is energized. If the semiconductor laser is not energized after the semiconductor laser controller is energized, the optical-electronic negative feedback loop is in a saturation state. As a result, the potential of the input part of Iin is reduced and transistors at the prior and subsequent stages are at a saturation state, so that the IC is latched-up. In order to prevent the potential of Iin from being excessively reduced and prevent the normal circuit operation from being interrupted, as indicated in FIG. 18, a transistor TR whose potential cannot be reduced below a potential which saturates the base voltage of the transistor and 0 during the circuit operation is provided.

Figures 19A, 19B:
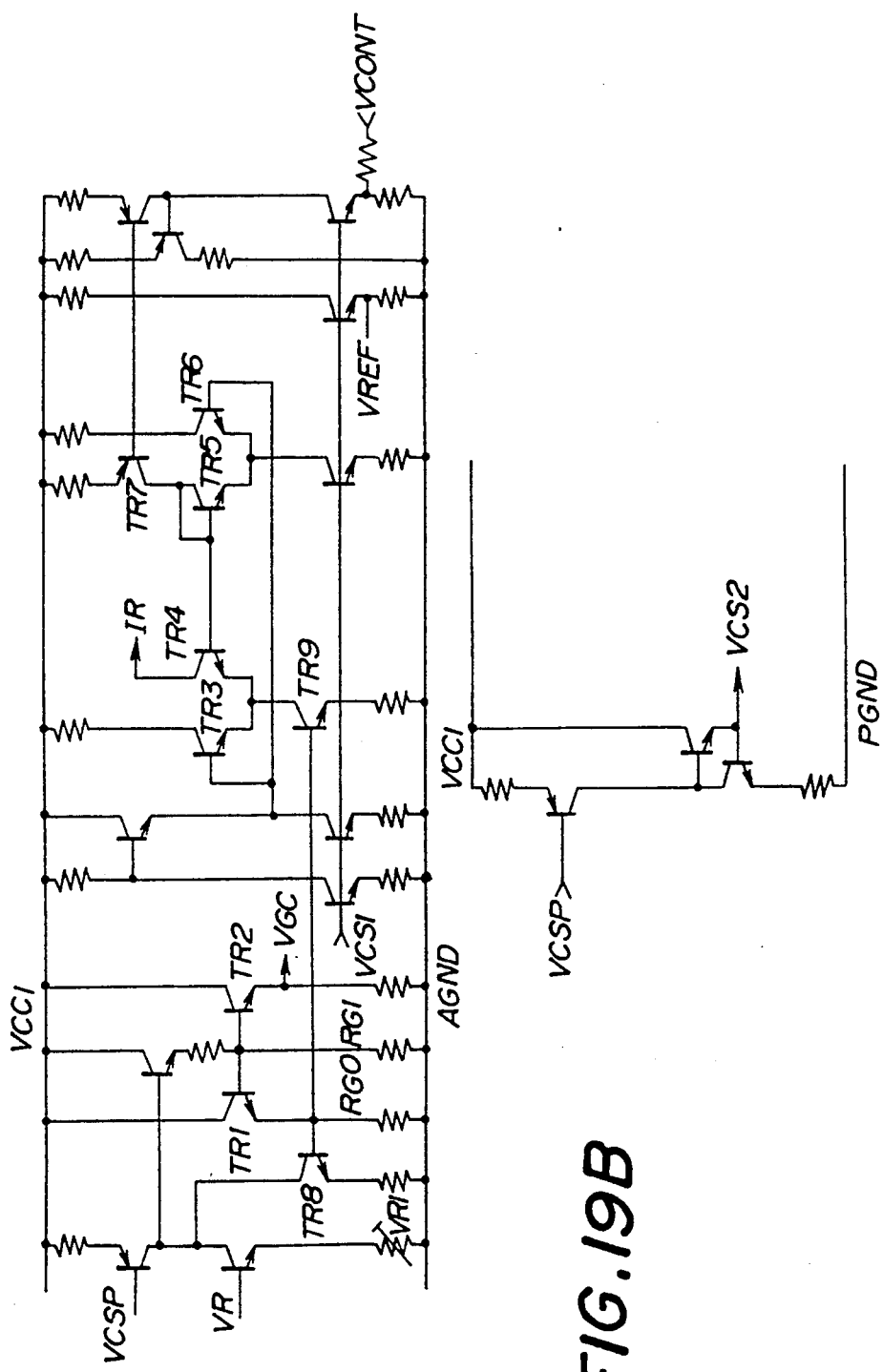
FIGS. 19A and 19B show circuitry constructions of a reference current generating part of the optical output setting circuit shown in FIG. 10.

FIGS. 19A and 19B show circuitry constructions of the reference current generating part of the optical output setting circuit. In FIGS. 19A and 19B, the voltage $V_R$ is applied to a base of a transistor so that an emitter-potential of the transistor can be constant. Thus, voltage between terminals of the additional resistor VR can be stable. By changing the resistance value of the resistor VR, a full-scale of the power-setting current and a gain in a case where the optical-electronic negative feedback loop is open change together. As the full-scale of the power-setting current increases, the gain of the open loop is reduced. Thus, when the resistance value of the resistor $VR_1$ is adjusted, all the input data of the level shift circuit are made high level and the power-setting current is adjusted so that the full-scale thereof can be made larger than the minimum value thereof, which is necessary to protect the semiconductor laser. When the resistor $VR_1$ is adjusted to stabilize the optical-electronic negative feedback loop, it is necessary to make a frequency lower than a desired value while a gain of the open loop is 1. This is achieved by the additional switch and the cascade capacitors (the switch is on during adjustment whereas the switch is off after adjustment).

When the variable resistor $VR_1$ has a low value, the full-scale becomes low, accordingly. In addition, since the change of the gain of the main amplifier is reversely proportional to the $I_0$, the $V_{GC}$ is generated so that it can change in proportion to the full-scale setting current of the power-setting current. However, unlike FIG. 1, due to the emitter resistance of the transistor, $V_{GC}$ is offset in comparison with FIG. 1 during voltage-to-current conversion of the main amplifier. In order to remove the offset, an emitter-current ratio between $TR_1$ and $TR_2$ can be adjusted. As a result, the full-scale setting current of the power-setting current and bias current of the pair of transistors in the main amplifier are not completely proportional to each other.

Incidentally, current established by the variable resistor $VR_1$ flows through transistor $TR_9$ and the collector-current of the transistor $VR_9$ is divided into the pair of transistors $TR_3$ and $TR_4$. The division ratio is equal to that between transistors $TR_5$ and $TR_6$. The division ratio of the transistors $TR_5$ and $TR_6$ is defined by setting current of $TR_7$ by the external input voltage $V_{CONT}$. Thus, by obtaining the division ratio proportional to the external input voltage, $I_R$ can be set. In addition, since the full-scale of the power-setting current indifferent to the main amplifier can be set, the maximum value of optical output of the semiconductor laser can be adjusted even after the $VR_1$ is adjusted and even while the semiconductor laser controller according to the present invention is in an active state.

Figure 20:
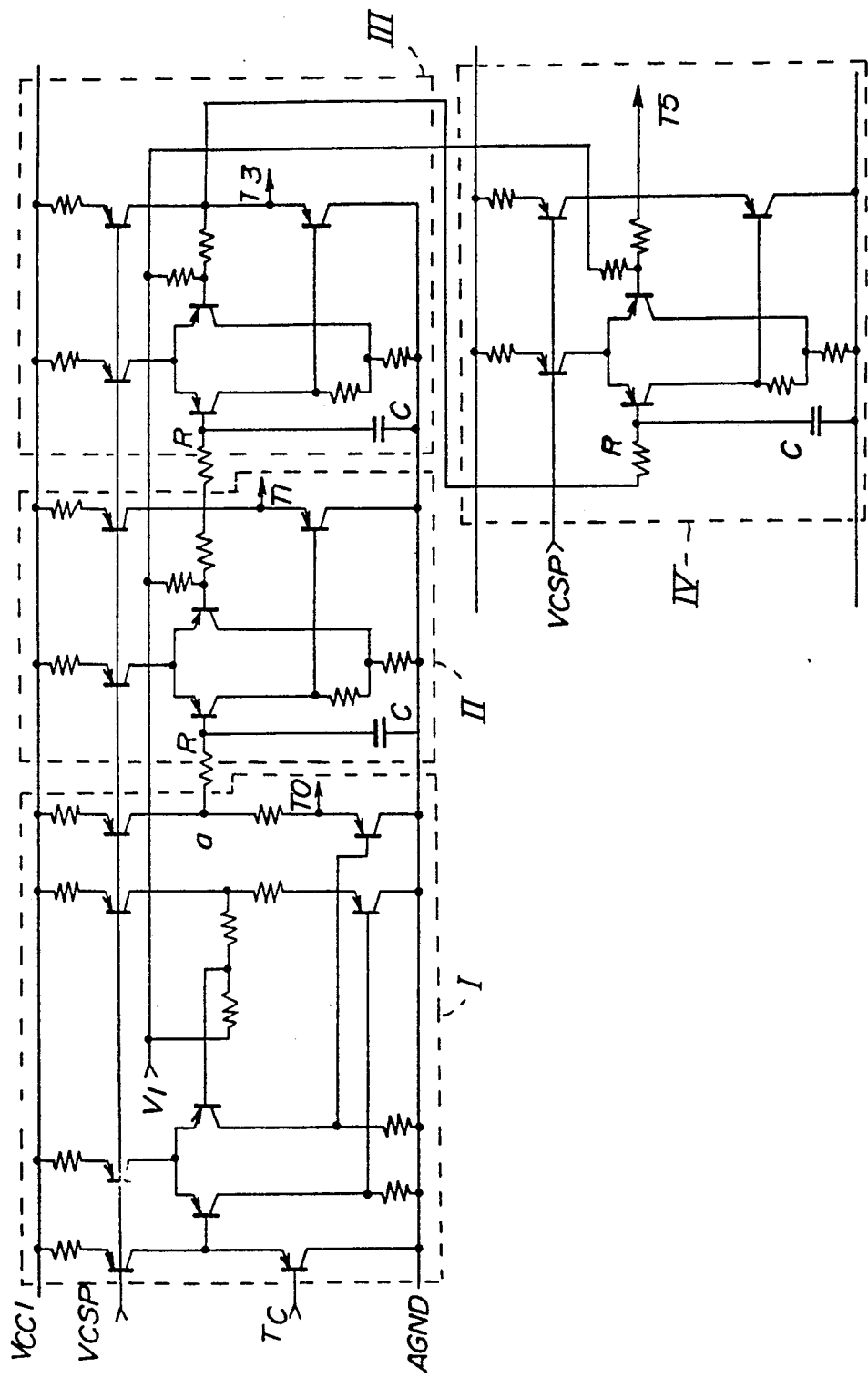
FIG. 20 shows a circuitry construction of a delay circuit shown in FIG. 10.

FIG. 20 shows a circuitry construction of the delay circuit. In part I, the operation timing of the transistor is a little delayed. Delay time $\Delta t_1$ can be generated from a signal at the point "a" and a RC time constant of part II shown in FIG. 9. In addition, delay time $\Delta t_2$ can be generated from a RC time constant of part III shown in FIG. 9. Moreover, delay time $\Delta t_3$ can be generated from the RC time constant of part IV shown in FIG. 9.

Figure 21:
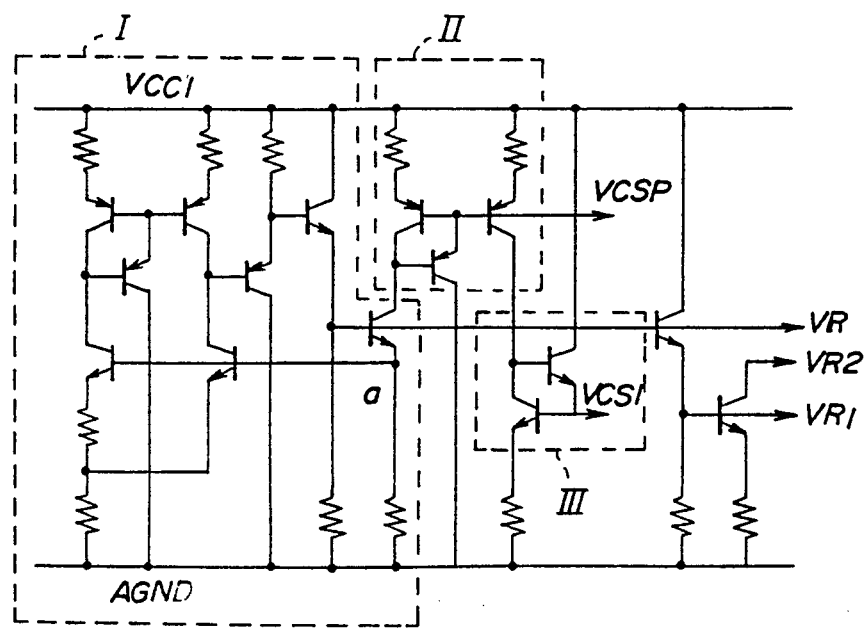
FIG. 21 shows a circuitry construction of a reference current generating circuit shown in FIG. 10.

FIG. 21 shows a circuitry construction of the reference voltage generating circuit. The circuit is constructed so that stable voltage is applied to the point "a" of part I. Part II indicates a current mirror circuit which generates voltage $V_{csp}$. In addition, part III indicates a current mirror circuit which generates voltage $V_{cs1}$. Voltage $V_R$ is generated so that the emitter-potential is stable when voltage is applied to a base of a transistor.

Further, the present invention is not limited to these preferred embodiments, and various variations and modifications may be made without departing from the scope of the present invention.

What is claimed is:

1. An apparatus comprising:
    a light-emitting element;
    a light-receiving element, optically coupled to said light-emitting element, which receives an optical output of said light-emitting element and generates light current proportional thereto;

power-setting current generating means for generating power-setting current which determines a desired optical output of said light-emitting element; and control means, coupled to said light-emitting element, light-receiving element, and power-setting current generating means so as to construct an optical-electronic negative feedback loop, which control means includes;

a capacitor, coupled to said light-receiving element and power-setting current generating means, which compares the power-setting current with the light current to calculate control-error voltage, a high-impedance circuit, coupled to the capacitor, which amplifies the control-error voltage, a voltage-to-current converter, coupled to the high-impedance circuit, which converts the control-error voltage amplified by the high-impedance circuit into control-error current proportional to the control-error voltage, source voltage, a first pair of bipolar transistors, each emitter thereof being coupled to the voltage-to-current converter, each collector thereof being connected to the source voltage, each base thereof having the same potential, constant current source, a second pair of bipolar transistors, each base thereof being coupled to the voltage-to-current converter and each corresponding one of the emitters of the first pair of bipolar transistors, each emitter thereof being coupled to the constant current source, the second pair of bipolar transistors having a current amplification factor large enough to allow collector-current thereof to approximate emitter-current thereof, and a forward current converter, coupled to the second pair of bipolar transistors and said light-emitting element, which controls the optical output of said light-emitting element by controlling driving current flowing through said light-emitting element based on the collector-current of the second pair of bipolar transistors.

2. An apparatus according to claim 1, further comprising a protection circuit which determines minimum voltage to be applied to the capacitor of said control means.

3. An apparatus according to claim 1, further comprising level setting means for setting a full-scale of the power-setting current.

4. An apparatus according to claim 3, wherein a maximum current value of the emitter-current of the first pair of bipolar transistors of said control means is changed while being approximately proportional to the full-scale set by said level setting means.

5. An apparatus according to claim 3, further comprising a capacitor and a switch which are configured to be parallel to the capacitor of said control means.

6. An apparatus according to claim 3, further comprising means for changing a maximum current value of the emitter-current of the first pair of transistors of said control means based on the full-scale set by said level setting means, said level setting means being able to set the full-scale of the power-setting current indifferent to the maximum current value of the emitter-current of the first pair of bipolar transistors.

7. An apparatus according to claim 6, wherein said level setting means comprises a third pair of bipolar transistors, said level setting means being able to set the full-scale of the power-setting current indifferent to the maximum current value of the emitter-current of the first pair of bipolar transistors by dividing current with the third pair of bipolar transistors thereof.

8. An apparatus according to claim 7, wherein said level setting means further comprises a fourth pair of bipolar transistors, said level setting means sets a division ratio of the third pair of bipolar transistors based on a current ratio between the fourth pair of bipolar transistors.

9. An apparatus according to claim 3, further comprising means for changing a maximum current value of the emitter-current of the first pair of transistors of said control means while adding an offset defined by the full-scale set by said level setting means to the power-setting current.

10. An apparatus according to claim 9, further comprising an analog-to-digital converter which performs an analog-to-digital conversion for the driving current of said light-emitting element, in accordance with a change of the power-setting current.

11. An apparatus comprising:
a light-emitting element;
a light-receiving element, optically coupled to said light-emitting element, which receives an optical output of said light-emitting element and generates light current proportional thereto;
power-setting current generating means for generating power-setting current which produces a desired optical output of said light-emitting element;
control means, coupled to said light-emitting element, light-receiving element, and power-setting current generating means so as to construct an optical-electronic negative feedback loop, which control means compares the light current with power-setting current to generate a control-error, and applies the control-error to said light-emitting element to control the optical output thereof;
a current-detecting circuit which detects a change in output of said control means when the power-setting current changes;
a first digital-to-analog converter;
a comparator which compares an output of said current-detecting circuit with that of said first digital-to-analog converter;
memory means for storing an output of said comparator at a predetermined timing;
a timing generating circuit which determines the predetermined timing;
a second digital-to-analog converter which performs a digital-to-analog conversion in accordance with an output of said memory means; and
a current adder which receives an output of said second digital-to-analog converter, and applies current proportional to power-setting current with a proportional coefficient determined by an output of said second digital-to-analog converter, to said light-emitting element.

12. An apparatus according to claim 11, wherein said current-detecting circuit comprises a high-pass filter.

13. An apparatus according to claim 11, wherein said power-setting current changes from a minimum value thereof to a maximum value thereof.

14. An apparatus according to claim 11, wherein said timing generating circuit comprises a delay circuit.

15. An apparatus according to claim 14, wherein a minimum value of delay time of the delay circuit is made longer than control time of the optical-electronic negative feedback loop.

16. An apparatus according to claim 11, wherein said control means includes:
- a capacitor, coupled to said light-receiving element and power-setting current generating means, which compares the power-setting current with the light current to calculate control-error voltage;
- a high-impedance circuit, coupled to the capacitor, which amplifies the control-error voltage;
- a voltage-to-current converter, coupled to the high-impedance circuit, which converts the control-error voltage amplified by the high-impedance circuit into control-error current proportional to the differential voltage;
- a source voltage;
- a first pair of bipolar transistors, each emitter thereof being coupled to the voltage-to-current converter, each collector thereof being connected to the source voltage, and each base thereof having the same potential;
- a constant current source;
- a second pair of bipolar transistors, each base thereof being coupled to the voltage-to-current converter and each corresponding one of the emitters of the first pair of bipolar transistors, and each emitter thereof being coupled to the constant current source, the second pair of bipolar transistors having a current amplification factor large enough to allow collector-current thereof to approximate emitter-current thereof; and
- a forward current converter, coupled to the second pair of bipolar transistors and said light-emitting element, which controls the optical output of said light-emitting element by controlling driving current flowing through said light-emitting element based on the collector-current of the second pair of bipolar transistors.

17. An apparatus comprising:
- a light-emitting element;
- a light-receiving element, optically coupled to said light-emitting element, which receives an optical output of said light-emitting element and generates light current proportional thereto;
- power-setting current generating means for generating power-setting current which produces a desired optical output of said light-emitting element;
- control means, coupled to said light-emitting element, light-receiving element, and power-setting current generating means so as to construct an optical-electronic negative feedback loop, which control means compares the light current with power-setting current to generate a control-error, and applies the control-error to said light-emitting element to control the optical output thereof;
- a digital-to-analog converter which performs a digital-to-analog conversion for forward current in accordance with a change of the power-setting current; and
- a current-detecting circuit which detects a change in output of said control means when the power-setting current changes.

18. An apparatus according to claim 17, wherein said current-detecting circuit comprises a high-pass filter.

19. An apparatus according to claim 17, wherein the power-setting current changes from a minimum value to a maximum value thereof.

20. An apparatus according to claim 19, wherein said current-detecting circuit comprises a high-pass filter.

21. An apparatus according to claim 17, further comprising a delay circuit which generates a conversion timing of each bit during the analog-to-digital conversion.

22. An apparatus according to claim 19, wherein said current-detecting circuit comprises a high-pass filter, and delay time for one bit of a conversion timing is made shorter than a time constant of the high-pass filter.

23. An apparatus according to claim 17, wherein said control means includes:
- a capacitor, coupled to said light-receiving element and power-setting current generating means, which compares the power-setting current with the light current to calculate control-error voltage;
- a high-impedance circuit, coupled to the capacitor, which amplifies the control-error voltage;
- a voltage-to-current converter, coupled to the high-impedance circuit, which converts the control-error voltage amplified by the high-impedance circuit into control-error current proportional to the differential voltage;
- a source voltage;
- a first pair of bipolar transistors, each emitter thereof being coupled to the voltage-to-current converter, each collector thereof being connected to the source voltage, and each base thereof having the same potential;
- a constant current source;
- a second pair of bipolar transistors, each base thereof being coupled to the voltage-to-current converter and each corresponding one of the emitters of the first pair of bipolar transistors, and each emitter thereof being coupled to the constant current source, the second pair of bipolar transistors having a current amplification factor large enough to allow collector-current thereof to approximate emitter-current thereof; and
- a forward current converter, coupled to the second pair of bipolar transistors and said light-emitting element, which controls the optical output of said light-emitting element by controlling driving current flowing through said light-emitting element based on the collector-current of the second pair of bipolar transistors.

* * * * *